United States Patent
Danilin

(10) Patent No.: US 10,409,168 B2
(45) Date of Patent: Sep. 10, 2019

(54) METHOD OF PREDICTING PERFORMANCE OF A LITHOGRAPHIC APPARATUS, CALIBRATION OF LITHOGRAPHIC APPARATUS, DEVICE MANUFACTURING METHOD

(71) Applicant: ASML NETHERLANDS B.V., Veldhoven (NL)

(72) Inventor: Alexander Alexandrovich Danilin, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/772,432

(22) PCT Filed: Oct. 11, 2016

(86) PCT No.: PCT/EP2016/074274
§ 371 (c)(1),
(2) Date: Apr. 30, 2018

(87) PCT Pub. No.: WO2017/080735
PCT Pub. Date: May 18, 2017

(65) Prior Publication Data
US 2018/0356736 A1    Dec. 13, 2018

(30) Foreign Application Priority Data
Nov. 13, 2015   (EP) .................................. 15194608

(51) Int. Cl.
*G03F 7/20*   (2006.01)

(52) U.S. Cl.
CPC .......... *G03F 7/70516* (2013.01); *G03F 7/705* (2013.01); *G03F 7/70508* (2013.01); *G03F 7/70633* (2013.01)

(58) Field of Classification Search
CPC ............................ G03F 7/70516; G03F 7/705
See application file for complete search history.

(56) References Cited

U.S. PATENT DOCUMENTS 8,976,355 B2    3/2015  Van Der Sanden et al.
9,177,219 B2   11/2015  Tel et al.
(Continued)

FOREIGN PATENT DOCUMENTS

EP        1760531        3/2007

OTHER PUBLICATIONS

International Search Report and Written Opinion dated Dec. 6, 2016 in corresponding International Patent Application No. PCT/EP2016/074274.

*Primary Examiner* — Steven Whitesell Gordon
(74) *Attorney, Agent, or Firm* — Pillsbury Winthrop Shaw Pittman LLP

(57) ABSTRACT

Measurement data is obtained for calibration fields that have been exposed by a lithographic apparatus using different field layouts and exposure sequences. The measurement data is classified in subsets by scan direction, step direction, field size and other variables. The measurement data is indexed by a time value that varies through each exposure sequence. Time values within different exposure sequences can be related using a normalized time value based on the beginning and end of each exposure sequence. An inter-field performance model is calculated for each subset. An intra-field component of a performance model is calculated with time as a third dimension. The time-indexed performance model is used to determine intra-field corrections for a variety of product exposures having product layouts and product exposure sequences different to the calibration fields, based on time and other a variables of the product layout and product exposure sequence.

20 Claims, 11 Drawing Sheets

(56) References Cited

U.S. PATENT DOCUMENTS

| | | |
|---|---|---|
| 2002/0105649 A1 | 8/2002 | Smith et al. |
| 2005/0136346 A1* | 6/2005 | Ottens ................ G03F 7/70616 430/30 |
| 2007/0052940 A1* | 3/2007 | Zaal .................... G03F 7/70341 355/53 |
| 2012/0008127 A1 | 1/2012 | Tel et al. |
| 2012/0057142 A1* | 3/2012 | Van Kemenade ...... G03F 7/705 355/67 |
| 2013/0050668 A1* | 2/2013 | Kisteman ............ G03F 7/70641 355/55 |
| 2013/0230797 A1 | 9/2013 | Van Der Sanden et al. |

\* cited by examiner

METHOD OF PREDICTING PERFORMANCE OF A LITHOGRAPHIC APPARATUS, CALIBRATION OF LITHOGRAPHIC APPARATUS, DEVICE MANUFACTURING METHOD

CROSS-REFERENCE TO RELATED APPLICATIONS

This application is the U.S. national phase entry of PCT patent application no. PCT/EP2016/074274, which was filed on Oct. 11, 2016, which claims the benefit of priority of European patent application no. 15194608.4, which was filed on Nov. 13, 2015, and which is incorporated herein in its entirety by reference.

FIELD

The invention relates to lithographic apparatuses, and in particular to predicting the performance of lithographic apparatuses for calibration or other purposes. The invention further relates to processing apparatuses and computer program products for implementing such methods. The invention further relates to methods of device manufacture.

BACKGROUND

A lithographic process is one that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a field (e.g. comprising part of, one, or several product dies) on a substrate (e.g. a silicon wafer). Transfer of the pattern is typically via imaging onto a layer of radiation-sensitive material (resist) provided on the substrate. Stepping and/or scanning movements can be involved, to repeat the pattern at successive target portions across the substrate. It is also possible to transfer the pattern from the patterning device to the substrate by imprinting the pattern onto the substrate. In the following description of examples, the term "exposure" may be used for convenience to refer to the step of applying a pattern to a field or to a substrate, without indicating any limitation to optical imaging or to exclude imprinting.

A key performance parameter of the lithographic apparatus is the overlay error. This error, often referred to simply as "overlay", is the error in placing a product features in the correct position relative to features formed in previous layers. As device structures become every smaller, overlay specifications become ever tighter. Overlay will be used as a main example of performance parameter in the present disclosure, while the concepts and techniques disclosed herein can in principle be applied to the measurement and improvement of other performance parameters as well. Examples of performance parameters of a lithographic process include for example critical dimension (CD), CD uniformity and the like.

Currently the overlay error is controlled and corrected by means of methods such as advanced process control (APC) described for example in US2012008127A1 and wafer alignment models described for example in US2013230797A1.

Within the lithographic apparatus, wafer alignment models are conventionally applied based on measurement of alignment marks provided on the substrate. The measurements are made by the lithographic apparatus as a preliminary step of every patterning operation. The alignment models may include higher order models, to correct for non-linear distortions of the wafer. The alignment models may also be expanded to take into account other measurements and/or calculated effects such as thermal deformation during a patterning operation To achieve good performance in the lithographic apparatus, it is generally necessary to perform a calibration of the apparatus after any interruption in operation. Calibration, broadly speaking, involves (i) using the apparatus, (ii) measuring the performance of the apparatus and (iii) based on errors observed in the measured performance, controlling the apparatus to correct the errors and improve performance in subsequent production. To achieve the highest possible performance, many individual variables have to be measured and taken into account.

As an example of such variables, some errors may be classed as "intra-field" errors that recur systematically depending on the position within each field. Other errors may be classed as "inter-field" errors that recur systematically as a function of position on the substrate as a whole. Furthermore, overlay in a particular field may be dependent on the particular scanning direction and/or stepping direction that is used by the lithographic apparatus to expose all the fields in an efficient manner. Changes in the product field size and/or exposure sequence may therefore change the performance of the apparatus. Consequently, to obtain highest performance currently requires new calibration of the lithography apparatus for each change in the product pattern (field size), or even if a new exposure sequence or new grid positioning is to be used. Calibration may have to be performed separately for each chuck (substrate support or wafer table) that may be used within the apparatus. Production is interrupted during the calibration. This directly reduces the production throughput of the lithographic apparatus. If the apparatus will be used for a long period to produce the same product, the lost throughput may be acceptable. Often, however, a lithographic apparatus is used to produce a number of different product layouts day-by-day or hour-by-hour, according to customer demand. Calibrating the apparatus for each individual layout or pattern is unfeasible, even for relatively modest numbers of individual layouts, since it would significantly reduce production throughput. On the other hand, not calibrating for each new design may significantly limit the overlay performance that can be achieved.

SUMMARY

It is therefore desirable to reduce the amount of time required to calibrate a lithographic apparatus. Additionally, it is desirable to improve the accuracy of the lithographic apparatus by reducing the overlay error due to the specific movements of the lithographic apparatus.

According to a first aspect, there is provided a method of predicting performance of a lithographic apparatus, the method comprising:

providing first measurement data for a first plurality of fields that have been exposed by the lithographic apparatus on one or more substrates using a first exposure sequence;

providing further measurement data for one or more further pluralities of fields that have been exposed by the lithographic apparatus on one or more substrates, each of the one or more further pluralities of fields having been exposed using an exposure sequence different from the first exposure sequence; and generating a performance model based on the first measurement data and the further measurement data; and using the performance model to determine a set of data for at least a first plurality of product fields having a product exposure sequence, wherein for generating the performance model the first measurement data and further measurement data are indexed at least partly on the basis of a time value that varies over each exposure sequence, and wherein the set of data for the product fields is generated at least partly by reference to a time value that varies over the product exposure sequence.

The performance model generated using the measurement data can be used as a "generic" or "master" performance model, from which specific performance models can be derived for a variety of specific product layouts and exposure sequences. The set of data generated for the specific product layouts and exposure sequence can be a good prediction of the performance of the lithographic apparatus when applying such a product layout, even though that product layout and/or exposure sequence is not directly represented included in the measurement data.

The indexing by time value allows the measurement data to be made relevant to a wide variety of product layouts and product exposure sequences.

In a particular example, the performance model predicts overlay performance of the lithographic apparatus, and is used to correct overlay when applying a product pattern to product fields on a substrate. Other parameters of performance, such as focus for example, can also be calibrated using the same technique.

The method may further comprise using the determined set of data to derive corrections for use in controlling the lithographic apparatus to apply a product pattern using the product layout and product exposure sequence. The method may further comprise using the corrections to control the lithographic apparatus when applying the product pattern to a substrate in fields having the product field dimensions.

According to a second aspect, a method of manufacturing devices is provided by using a lithographic apparatus to apply product patterns to substrates, the lithographic apparatus applying said product patterns to fields using a product exposure sequence using correction parameters obtained by the method according to any aspect as set forth above or in the embodiments below.

According to a third aspect, a processing apparatus is provided for predicting performance of a lithographic process, the apparatus comprising a processor arranged for performing the steps of a method of predicting performance as set forth above.

According to a fourth aspect, an apparatus for calibrating a lithographic apparatus is provided, the apparatus comprising:

storage containing a performance model generated by the generating step of a method as set forth above;

a processor arranged for using the performance model to determine a set of data for at least a first plurality of product fields having a product field layout and a product exposure sequence; and a processor for using the set of data to generate corrections to be used while applying a product pattern to plurality of product fields on a product substrate using the product filed layout and product exposure sequence.

According to a fifth aspect, a control system for a lithographic apparatus is provided, the control system comprising:

a calibrating apparatus for as set forth above for generating corrections to be used by the lithographic apparatus; and a controller for causing the lithographic apparatus to apply one or more product patterns using the generated corrections.

According to a sixth aspect, a computer program product is provided comprising machine-readable instructions for causing a data processing apparatus or apparatuses to implement a method and/or apparatus according to any aspect as set forth above or in the embodiments below.

These and further features and advantages of the embodiments will be apparent to the skilled reader from a consideration of the detailed description of examples that follows.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
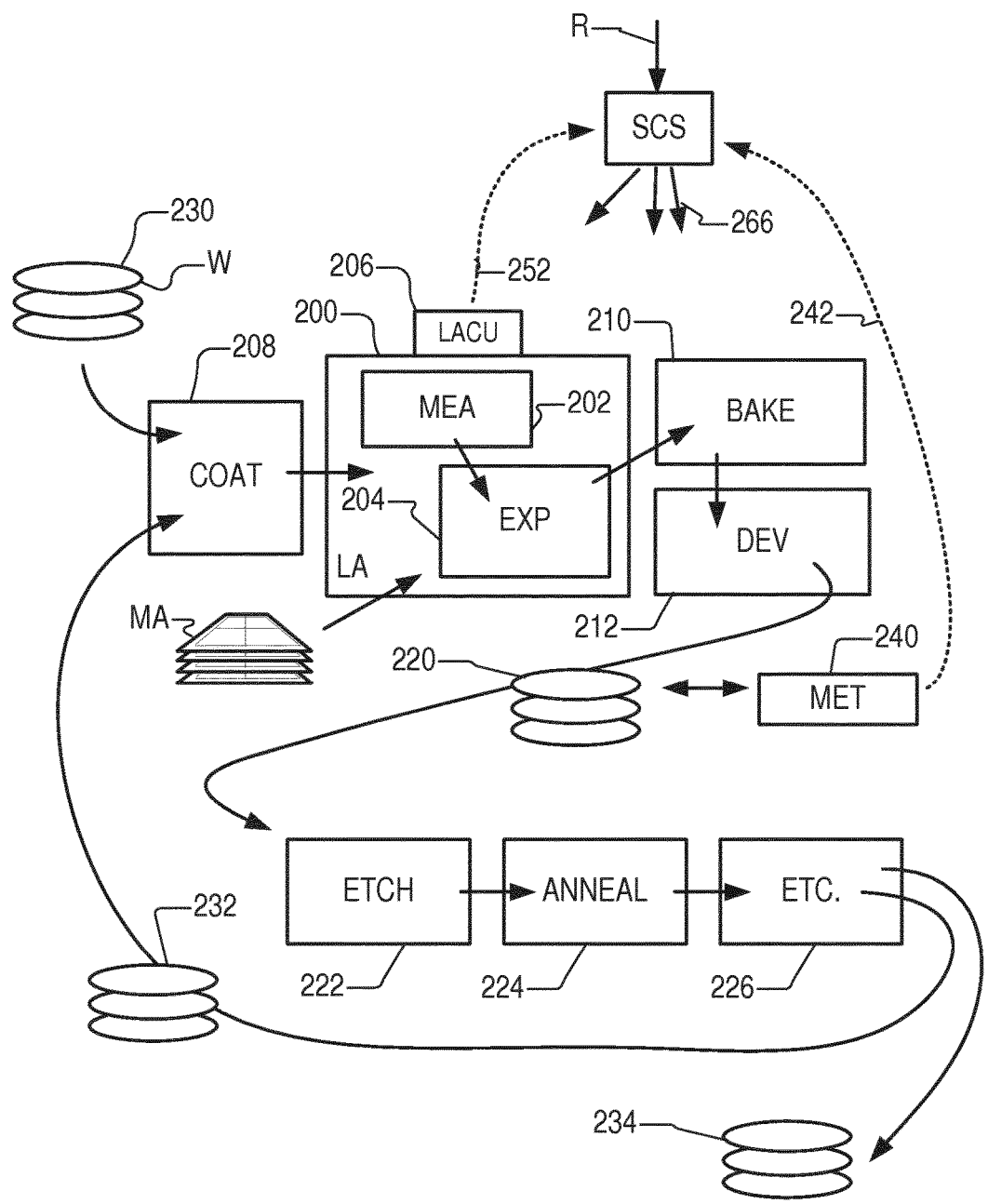
FIG. 1 depicts a lithographic apparatus together with other apparatuses forming a production facility for semiconductor devices.

FIG. 1 at 200 shows a lithographic apparatus LA as part of an industrial production facility implementing a highvolume, lithographic manufacturing process. In the present example, the manufacturing process is adapted for the manufacture of for semiconductor products (integrated circuits) on substrates such as semiconductor wafers. The skilled person will appreciate that a wide variety of products may be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many fields across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU is realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice measures in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate is loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA in this example is of a so-called dual stage type which has two substrate tables WTa and WTb and two stations—an exposure station and a measurement station—between which the substrate tables may be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus may be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation may be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines could mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology may be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures are performed only on those target portions which are good.

The metrology system in FIG. 1 includes a metrology apparatus 240 which is provided for making measurements of parameters of the products at desired stages in the manufacturing process. A common example of a metrology station in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 may be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) may be applied to measure properties of the processed substrates 232, 234, and incoming substrates 230.

As is well known, the pattern applied in one exposure covers only a small portion of the substrate at a time, and the same pattern is typically applied repeatedly over the substrate to make full use of the capacity of the substrate and of the production facility as a whole. The portion to which the pattern is applied is termed a "field", and its maximum size is limited by the field of view of the optical projection system and other limitations of the apparatus design. On the other hand, not all products require a die which fits neatly within that maximum field size. Wasted space on a substrate is not tolerable in view of the cost of establishing and running the production facility, and so for each product a particular size and shape smaller than the maximum size will generally be selected. In the example of the scanning mode of operation, the lithographic apparatus may be controlled to operate with a shorter scan length and/or a shorter step size, to ensure optimum filling of the substrate area with fields of and particular size and shape.

As explained in the introduction, to obtain best performance in terms of overlay or other performance parameters, a set of calibration measurements is performed on one or several substrates to which calibration patterns have been applied by the individual lithographic apparatus. In practice, as mentioned in the introduction, some or all of the calibration patterning may need to be repeated using the different substrate tables or "chucks" WTa, WTb. The calibration patterning operations impact the throughput of product substrates. One particular problem in this regard is that overlay performance of a particular lithographic apparatus may be different for different products and layouts. For example some layouts have different field sizes. An operator may wish to use the same lithographic tool for several products, each with a different field size. Even if the field size does not change, other parameters of the exposure process may change, for example the sequence of up/down and left/right movements used in the exposure of fields in a grid layout, and/or the position of the grid relative to the substrate. Therefore to obtain best performance it may be necessary to carry out calibrations specific to each product and each grid layout, and each chuck, before starting production of the product. This significantly increases the time, and therefore the cost, of the calibration process.

Figure 2:
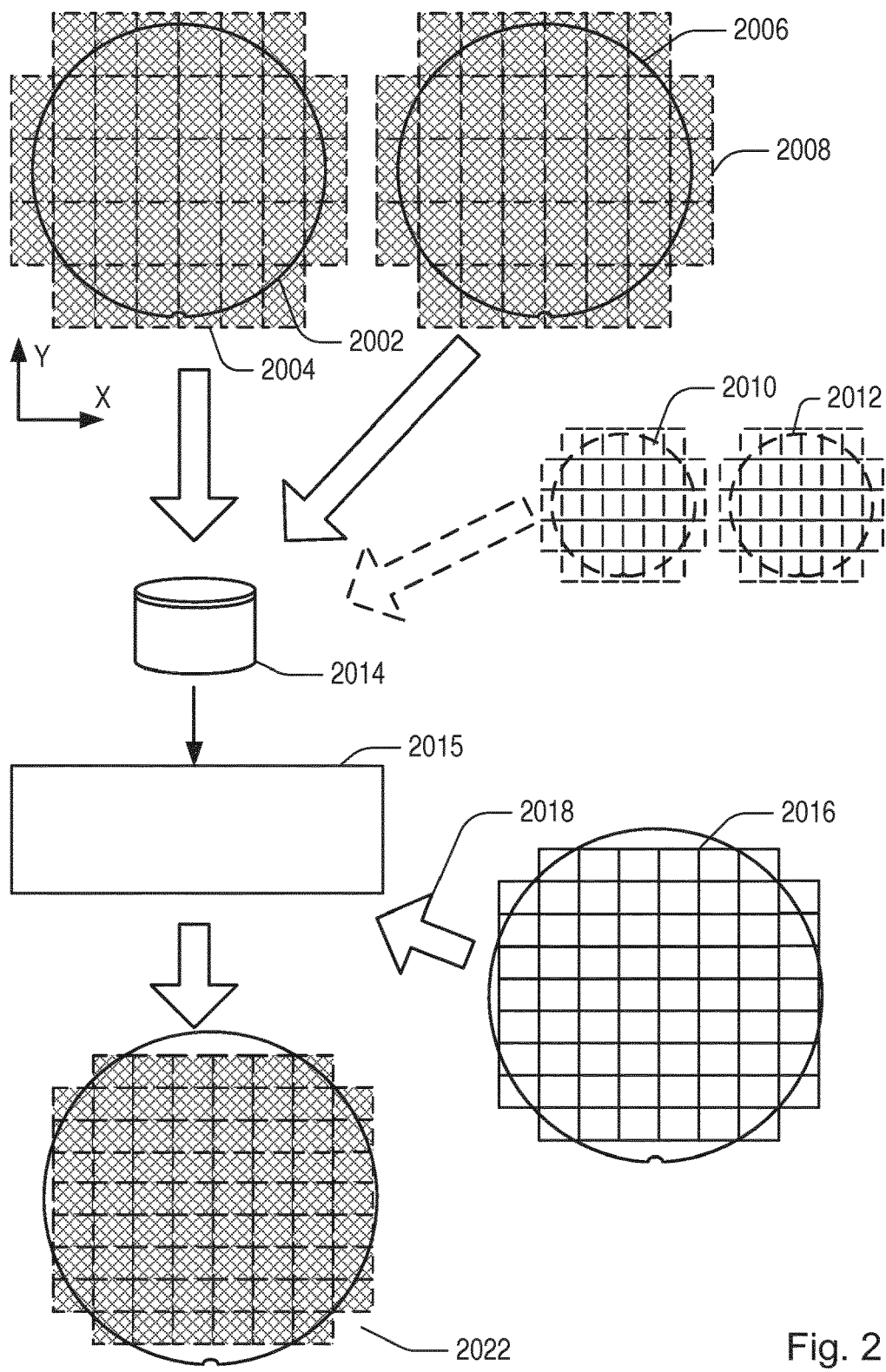
FIG. 2 depicts the principle of a calibration method according to an embodiment of the invention.

FIG. 2 shows the principle of an exemplary method of calibration according to an aspect of the present disclosure. A first substrate 2002 has a calibration pattern applied to a first plurality of fields 2004. In the present example, the substrate is a calibration substrate on which a calibration pattern is applied to a plurality of equally sized and spaced fields. A second substrate 2006 has a calibration pattern applied to a plurality of fields 2008. Optionally, a third substrate 2010 and a fourth substrate 2012 have calibration patterns applied to a plurality of fields. While the present example describes the use of dedicated calibration patterns and dedicated calibration substrates, the terms "calibration pattern" and "calibration substrate" are not intended to exclude the use of actual product patterns for the purposes of calibration.

Each field has, for example, a height in a Y direction and a width in an X direction. (It will be understood that these terms refer only to the appearance of the pattern in the plane of the substrate, and not to height relative to earth or gravity). In one example of the method, the fields 2004, 2008 on the first and second substrates in this example have the same layout (same size, shape and positions) as shown in FIG. 2. They differ only in the sequence of step and scanning movements that are used to apply the patterns. In other words, fields 2004 on the first substrate are exposed using a first exposure sequence, fields 2008 on the second plurality are exposed using a second exposure sequence different from the first one. Similarly, the third and fourth substrates, where provided, may be provided with calibration patterns having the same field size, field shape and field position as each another. The fields applied to the third and fourth substrates may differ from those of the first and second substrates, however, differing in field positions, and/or different field size or shape.

Substrates 2002, 2006, 2010 and 2012 are shown in FIG. 2 as separate substrates, which may be a convenient implementation. However, methods for obtaining multiple measurements on one substrate may also be used, as will be explained in further detail below. Different field sizes could in principle be mixed on a single substrate, provided that the performance of the apparatus in applying patterns with these different field sizes can be measured separately.

As mentioned above, the maximum size of a field is determined by the design of the lithographic apparatus. In the illustrated example, the fields 2004 and 2008 on the first and second substrates 2002 and 2006 have this maximum field size. Accordingly, particular products will generally be designed and laid out using smaller fields. (In other examples it may be that the lithographic apparatus will be used for the production of products all having smaller field sizes. In such a case, the calibration patterns may be applied with a smaller field size, closer to the maximum field size of the intended product layouts.)

In the method disclosed herein calibration measurements are performed on the patterned substrates 2002, 2006, 2010, 2012 and used to obtain corrections for use in controlling the lithographic apparatus when applying product patterns to subsequent substrates. In the present method, however, calibration substrates and measurements are not prepared for every different size and shape of product field. Rather, measurement data representing the performance of the apparatus on fields of applied using different exposure sequences (fields 2004, 2008 in this example) is gathered together in a database 2014 and used to synthesize the information needed to calibrate the apparatus for a product layout and exposure sequence. From the database of measurements of calibration substrates with different exposure sequences, a performance model 2015 is derived that may be used to obtain a set of data specific to a product layout and exposure sequence different from the layout and exposure sequence of the physical calibration patterns and measurements. The performance model is used to predict the performance of the lithographic apparatus when applying a product pattern with a particular product layout and exposure sequence, field size and shape.

As an example, a designed product layout for a product substrate comprises a number of fields 2016. In this example, each field has a particular set of field dimensions which is different to the dimensions of the fields 2004, 2008. The designed product layout and exposure sequence are specified with other parameters in a product recipe 2018. The product recipe is used with the performance model to obtain a specific performance model 2022 that predicts the performance of the lithographic apparatus when patterning a substrate using the product layout and exposure sequence specified in the recipe. The predicted behavior may be used as input for a correction model in a lithographic apparatus. Metrology apparatus 240 of FIG. 1 may be used to make the measurements. The measurement data may be delivered as data 242 to database 2014 that lies within the supervisory control system, or it may lie within the lithographic apparatus control unit LACU. In any case, the control unit LACU in due course receives the information it requires for correcting any performance errors predicted by the specific performance model, and uses the information to improve performance when exposing product fields on real product substrates.

It will be appreciated that the corrections to be applied are (at least at a simplistic level) an inverse of errors predicted in the specific performance model. Accordingly, it is a matter of implementation whether the performance model 2015 delivers its output firstly in the form of a prediction, which then has to be converted to correction parameters, or whether it is arranged to deliver directly the necessary correction parameters. To a large extent the implementation will depend simply on what form of data is easiest to handle by the control unit and its subsystems. The predicted performance model and/or correction parameters can be combined with corrections from other sources, such as the stability module, substrate process history and the like, to obtain a complete set of corrections. Of course for the individual substrate, the control unit also uses the alignment model based on measurements taken by alignment sensors and level sensors in the measuring station MEA, immediately prior to exposure.

In order to allow calibration for a number of different variables and a diverse range of error sources, it is customary to classify each measurement in the database 2014 so that specific subsets of measurement can be used selectively in different contexts. The database 2014 may be indexed so that measurements can be selected based on any number of index variables. Each measurement is effectively positioned at a point in a multi-dimensional space, whose dimensions are the indexing variables. Indexing variables for each performance measurement may be for example inter-field position (xw, yw), intra-field position (xf, yf) and field center position (xc, yc). Additional indexing variables for sub-sampling the measurement data include for example scanning direction (SU, SD), stepping direction (SL, SR), or any other variable that may be correlated with a physical error source. The index variables in database 2014 can be used in the performance model 2015 to predict performance when those variables vary in a production situation.

A particular feature of the database 2014 in this example, is that the performance measurements are also indexed by a time value, representing variation of time within the exposure sequence by which the calibration patterns were applied. The time value can be represented on a normalized scale, so that it is easy to relate time values between exposure sequences having different durations in real time. As will be shown below, it has been found that a performance model indexed by time can yield quite accurate predictions over a wide range of product layouts and exposure sequences, with comparatively little calibration overhead.

Figure 3:
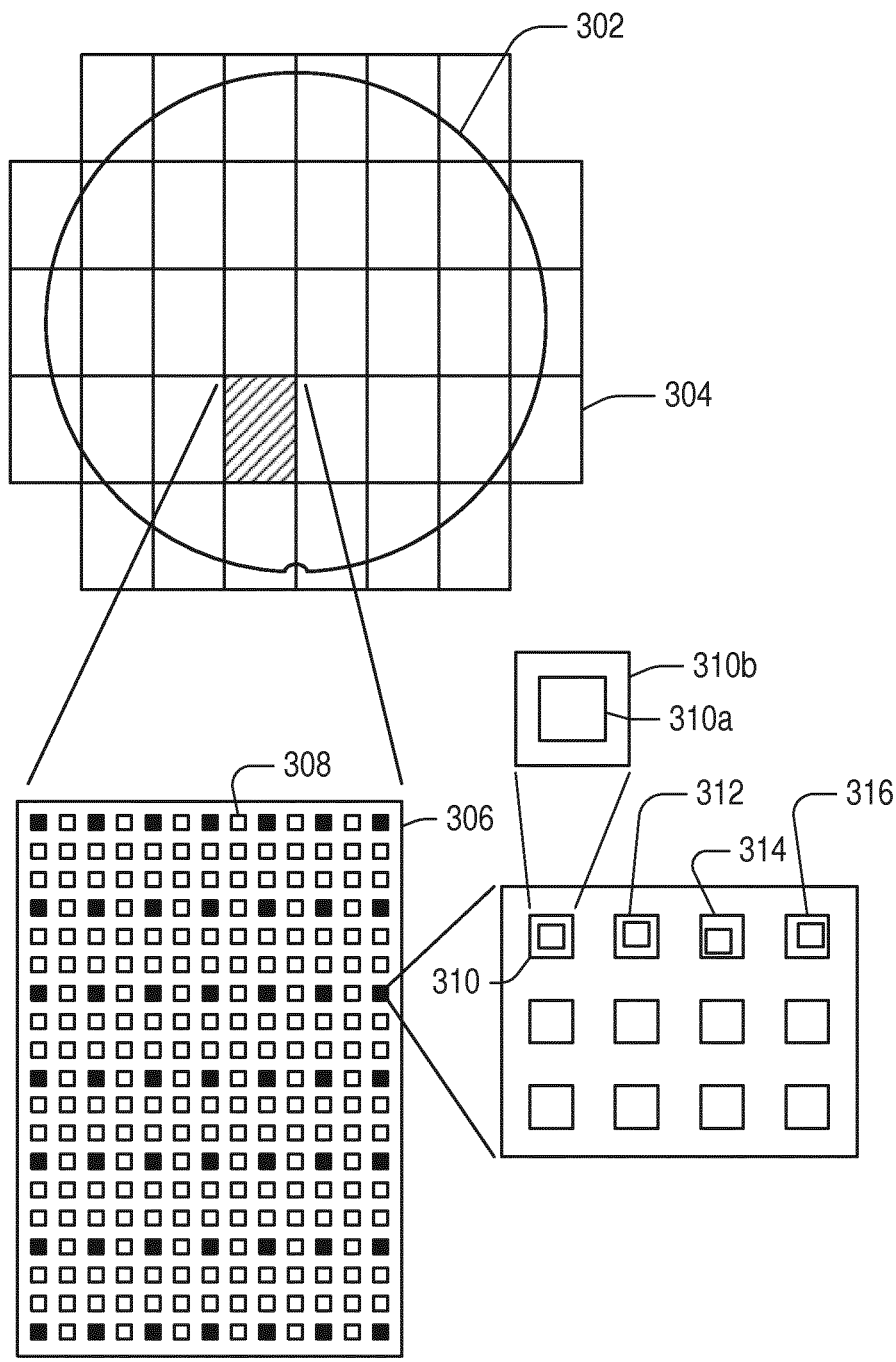
FIG. 3 shows schematically an example of a calibration pattern usable in the method of FIG. 2.

FIG. 3 shows an exemplary calibration substrate 302. As described above, calibration measurements in accordance with one embodiment of the method are carried out on a plurality of calibration patterns applied to one or more calibration substrates. The substrate is divided into a number of fields 304, each of which has a calibration pattern 306 applied to it. The pattern may be defined by providing a special calibration patterning device in the lithographic apparatus. Alternatively, a real product design may contain features usable for calibration. In one example, the target pattern comprises overlay targets located in target areas 308 uniformly spaced in a grid pattern across every field. As illustrated in the enlarged insert, each target area 308 may contain a plurality of individual targets 310, 312, 314, 316 etc. These targets are offset from one another by small amounts, while remaining at the general location of the area 308. This provision of multiple targets with offsets is to allow multiple exposures and multiple overlay measurements to be performed on the same substrate and at substantially the same locations. The offsets may be for example measured in tens of microns, while the field size is measured in tens of millimeters.

The design of the targets and the nature of the measurement taken may depend on which parameters of performance are to be improved by the calibration. In the following examples, overlay is the parameter of interest. Overlay relates of positioning errors in the plane of the substrate (X and Y directions). Another parameter of interest is likely to be focus, which relates to positioning errors normal to the plane of the substrate (Z direction). Targets for measuring these and/or other performance parameters may be provided on the same calibration substrates, or on different calibration substrates.

Referring to the example case of overlay targets, each individual target typically comprises a bottom mark in an underlying layer and a top mark to be formed in the present lithographic apparatus. The bottom marks may have been formed using the same lithographic apparatus or a different one. During application of a calibration pattern, a top mark is applied overlying a particular bottom mark in each target area 308. For example, in a particular calibration patterning operation, top mark 310a may be applied over bottom mark 310b. During a calibration measurement, the overlay error between the top target mark and the bottom target mark is measured. Overlay error causes the marks to be misaligned in one or both of the X and Y directions.

Within each individual target, features may typically be provided to allow measurement in both X and Y directions in a single structure target, or different targets may be provided in a composite target, for measuring overlay in X and Y separately. The drawing shows each target as a simple "box-in-box" target for the sake of illustration only. The targets may indeed be of 'box-in-box' type suitable for image-based overlay metrology; according to modern techniques, however, they may be gratings, to be measured by diffraction-based overlay in a well-known manner. Hybrid targets having both image and grating features may be used. The exact type of target, and indeed the manner of measuring, is a matter of implementation. As mentioned, overlay is not the only performance parameter that might be measured, and other types of target and other metrology techniques may be applied, as appropriate to the parameters of interest.

As an example, each specific target in an overlay target area 308 may have been applied separately during successive exposures using different exposure sequences. As will be described further below, it may be desired that the performance model 2015 can take account of inter-field variations and intra-field variations in performance for the given product field size. It may further be desired that the performance model 2015 can take account of subtle variations in performance that are associated with different scanning directions and/or stepping direction. In other words, a calibration is desired that is specific to a particular exposure sequence, as well as a particular field size and shape, in order to obtain best performance.

Accordingly, in an example, it may be that target 310 has been formed during a first patterning operation, forming a first plurality of fields using a first exposure sequence. Similarly, target 312 may have been formed during a second patterning operation, forming a second plurality of fields using the second exposure sequence. Target 314 may have been formed during a third patterning operation, while target 316 has been formed during a fourth patterning operation. In this way, two or more sets of measurement data can be gathered from the one substrate. These sets of measurement data can be used to generate the performance model, as will be described in more detail below. By suitable design, it is possible to apply all the calibration marks in the same resist layer by multiple exposures.

Instead of performing multiple exposures in the same resist, one could make four cycles of coating, exposure and development on the same substrate. These variations should be considered as variants that do not depart from the basic operation of applying a pattern by one or more exposures using the lithographic apparatus. Any of the above patterning operations can be implemented using multiple "mini dose" exposures, rather than a single exposure. Irradiating the resist material with multiple mini doses allows a target pattern to be applied in which random noise effects are suppressed. For example, four doses of one quarter the desired total dose may be used.

Alternatively or additionally, targets in an overlay target area may be applied during successive exposures using different field dimensions. Whether this is possible will depend on the design of the calibration pattern. Using the example where different field sizes are used to obtain measurement data for the database 2014, it will be noticed that the twelve targets in each area 308 conveniently allow for four sets of measurement data to be gathered for each of the three unique filed dimensions (2004, 2008, 2012).

As a general point, the skilled reader will know that metrology in this technical field typically requires that each value be measured several times to obtain a statistically reliable measurement and to eliminate as far as possible the effects of random error sources. Thus, for example, each set of calibration patterns may in practice be applied to several different substrates and each applied mark may be measured several times to obtain a single value for the overlay performance of the lithographic apparatus at that mark position. Any discussion of a patterning operation or a measurement in the present application therefore should be taken to refer potentially to the performance of several identical operations. The need to repeat patterning and measurement to obtain the highest accuracy highlights again the penalty in throughput that is incurred when a calibration has to be performed in a production facility.

While in this example a reference image providing multiple individual target marks with shifts is illustrated, this is not essential. Other embodiments may be envisaged in which multiple marks are printed with shifts relative to a single reference mark, and separate measurement values can be obtained from them. As also illustrated, even with the types of mark illustrated, multiple exposures can be made without shifts, where a pattern is applied at different field positions across the substrate, or different portions of a field are patterned in different exposures.

Figure 4:
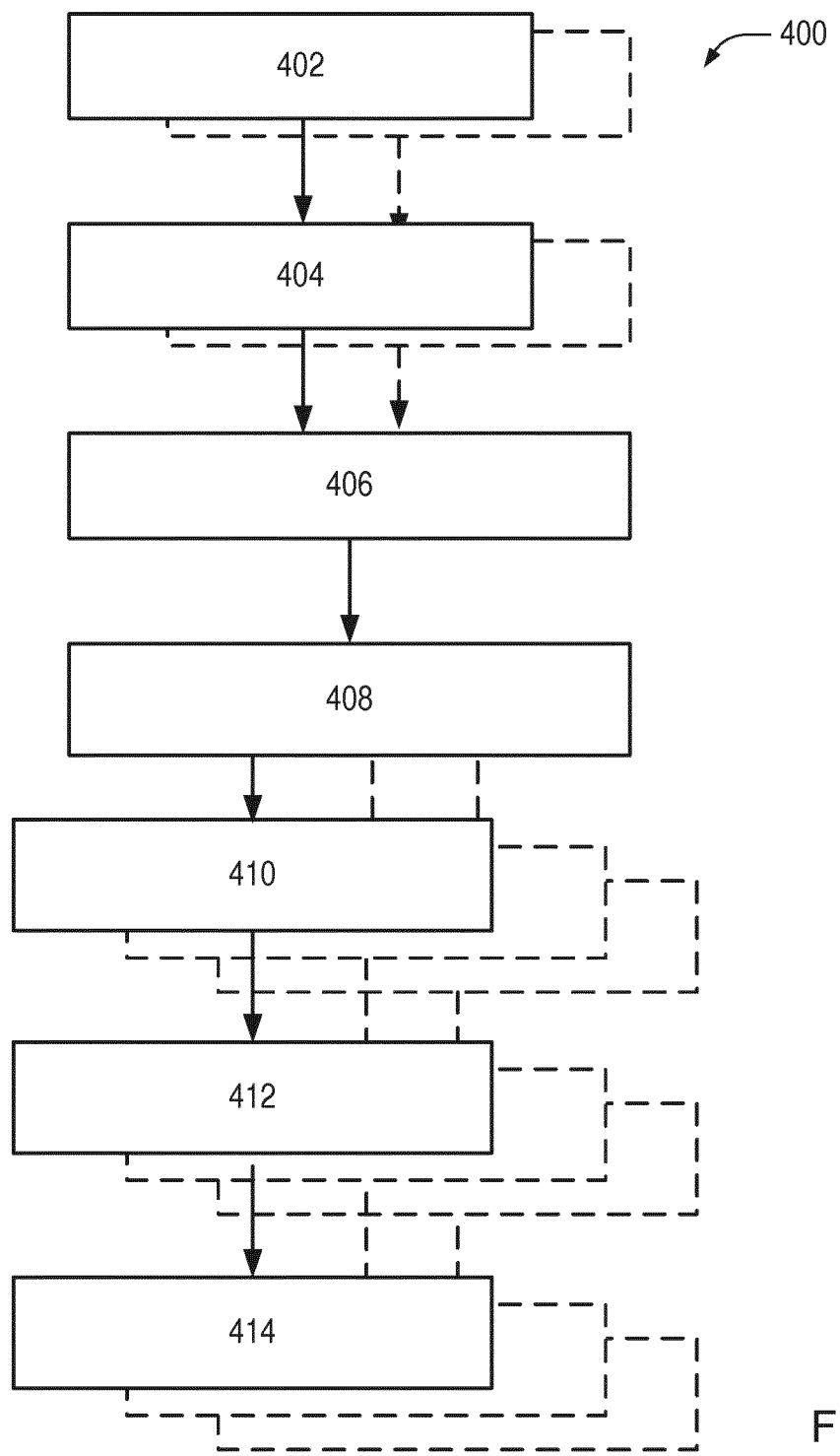
FIG. 4 is a flowchart of a calibration method according to an embodiment of the invention, including the manufacture of devices using the calibration method.

With reference to FIG. 4, a method 400 for carrying out a calibration according to the principles described above will now be described. The reference numerals in this figure refer to the following steps, each of which will be explained in more detail (with reference also to the other drawings):

402: apply calibration patterns to one or more substrates using different exposure sequences;

404: perform calibration measurements on the calibration patterns;

406: collect the measurement data into a database where it can be classified into various sets and subsets, based on one or more indexing variables. for example based on scanning and stepping directions, but also based at least partly on the time value mentioned above;

408: generate a performance model that can be interrogated using the indexing variables;

410: use the performance model to predict performance for product fields having a one or more new layouts and/or new exposure sequences; and 412: use predicted performance to calculate corrections for the one or more product layouts and exposure sequences;

414: use the calculated corrections in controlling operation of lithographic apparatus to expose product fields according to the product layouts.

As will be seen from the drawing, the steps 402 and 404 can be performed more than once, to create and measure calibration patterns using different field layouts. The steps to obtain the measurement data for each field layout is the same, and so will only be described once.

In step 402 of the method 400, a calibration pattern is applied to a first plurality of fields across a calibration substrate and a second plurality of fields across the same or another calibration substrate. As shown in broken lines, additional calibration patterns may applied. but it is sufficient to consider just two for a simple implementation.

Figure 5:
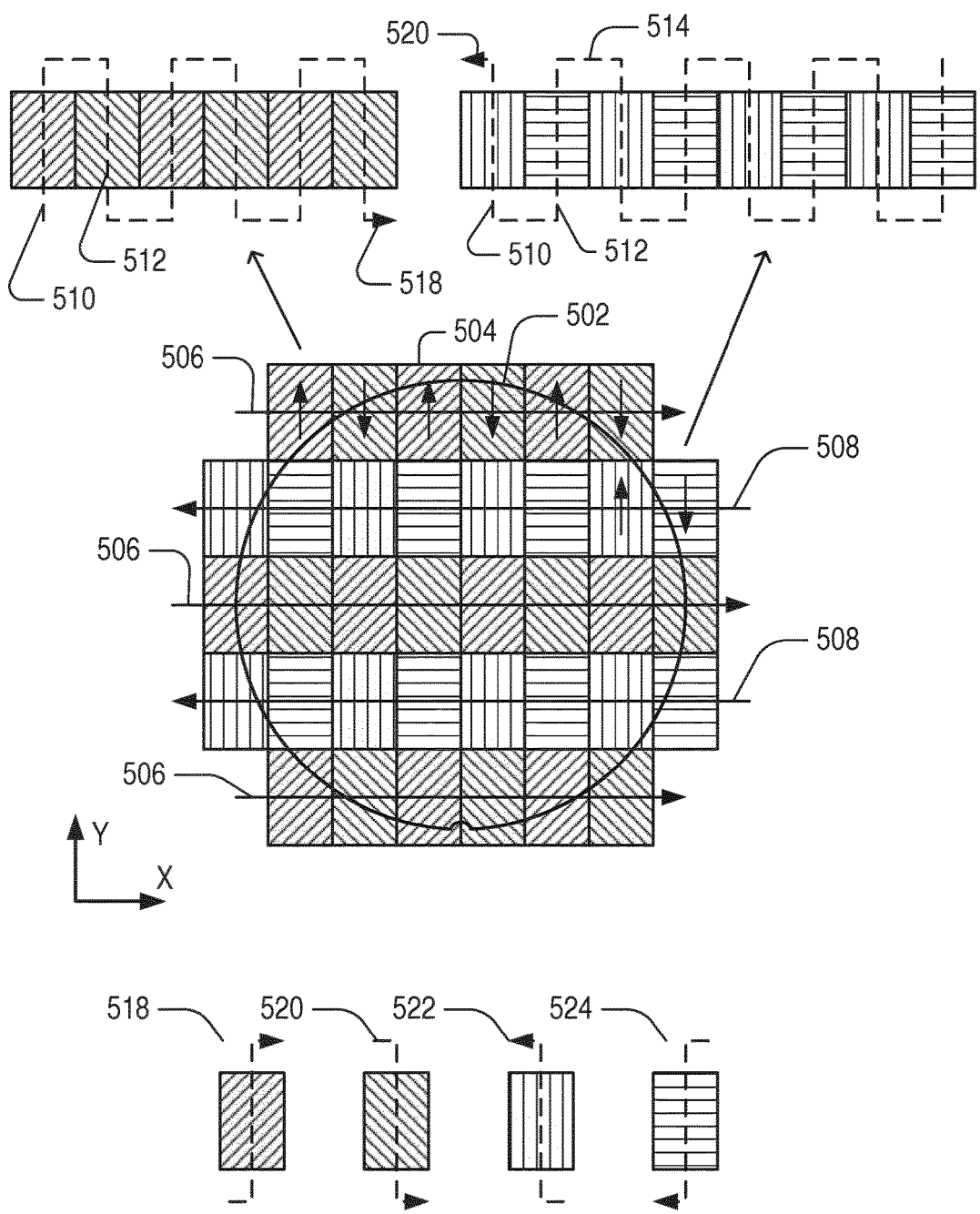
FIG. 5 is a schematic diagram of a calibration substrate patterned by a lithographic apparatus with a first exposure sequence in the method of FIG. 4.

As shown schematically in FIG. 5, a calibration substrate 502 is divided into a number of fields 504 that are arranged in a grid pattern. During a patterning operation, patterns are applied to each field on the substrate in an exposure sequence. In a scanning-type lithographic apparatus, the exposure sequence comprises a sequence of stepping and scanning movements by which each field on a substrate is patterned in an efficient or advantageous manner. By convention, the stepping direction is aligned with the X axis of the substrate coordinate system. The scanning direction is aligned with the Y axis of the substrate coordinate system. It is to be noted that the stepping and scanning movements to be described are purely relative movements between the patterning device, the optical projection system and the substrate during a patterning operation. These relative movements can be effected in a number of ways. In principle, it does not matter which components move and which remain static, so long as overall their relative movements achieve the desired image formation and image placement. In practical apparatuses, in the scanning mode of operation, movements of the patterning device and the substrate are controlled in a carefully synchronized manner, while the projection system remains largely stationary. On the other hand, for purposes of illustration, the operation can be visualized as if the lithographic apparatus were stepping and scanning over the substrate.

With that in mind, an example exposure sequence for an example field size is indicated by the dashed arrows 518, 520 in the detailed views above the main portion of the figure. Each field is patterned by scanning either in the positive Y direction (referred to for example as the "scan up" direction) 510 or in the negative Y direction (the "scan down" direction) 512. After exposing a particular field, the apparatus steps in either the negative X direction 514 (referred for example as "stepping left") or in the positive X direction 516 (referred to as "stepping right"). After a left or right step, a next field is typically patterned in the opposite direction to that of the previous field. Thus, if a particular field has been exposed by scanning in the "up" direction, the next field is exposed by scanning in the "down" direction. This minimizes unnecessary movement of the lithographic apparatus, thereby reducing the amount of time required to process each substrate. On the other hand, it does mean that each field is exposed using a slightly set of movements. This is the reason that overlay can vary between fields in a systematic manner, depending on the scan and step directions.

It will be understood that the labels "up", "down", "left" and "right" are merely convenient labels for explanation and understanding, and to not refer to any particular orientation or reference frame in the physical world. Typically the stepping motion is performed so that the next field is the immediately adjacent field, and exposure progresses row-by-row. This customary "meander" pattern is exploited to some extent in the time-indexed performance models to be described. In principle, alternative sequences can be implemented if they are found to be advantageous.

In this fashion, the calibration pattern is applied successively to each field in a particular row of fields on the calibration substrate, while stepping generally in a left-to-right or a right-to-left direction. When one row of fields has been patterned, the lithographic apparatus applies the calibration pattern to the next row of fields, but (usually) stepping in the opposite direction to the previous row. In the present example, it is considered that the "top" row of fields is exposed first, by stepping in a left-to-right direction (arrow 506), and the next row of fields is exposed in a right-to-left direction (arrow 508).

On the first few fields in FIG. 5, up and down arrows illustrate the scanning direction used when exposing each field. Further, hatching is used to indicate for each field which combination of scan and step directions is used. The insert below the main figure shows how different hatching represents each of the four scan and step combinations used to apply the pattern to different fields on the calibration substrate in the present example. These are: scan up/step right (SUSR) 518; scan down/step right (SDSR) 520; scan up/step left (SUSL) 522; and scan down/step left (SDSL) 524.

As explained above, overlay performance of the lithographic apparatus in a particular field may be partly dependent on the scanning and stepping direction used during the exposure (patterning) of that field. Consequently, as an example overlay performance in a particular field that has been patterned using the up/left combination may differ in a small but systematic way from overlay performance in an identical field that has been patterned using the down/right combination. The calibration method can correct for this systematic error, provided it has suitable sets of measurement data from which to observe the systematic effects. For this reason, in the illustrated method, each field on the calibration substrate is patterned two or more times. In the first embodiment to be described, the patterning operation is repeated with a different exposure sequence so that each field position in the layout has been patterned using the two different scan directions (SU, SD). In a second embodiment, described briefly below, the patterning operation is repeated with different exposure sequences so that each field position in the layout has been patterned using each of the four scan and step combinations discussed with reference to FIG. 5.

Figure 6:
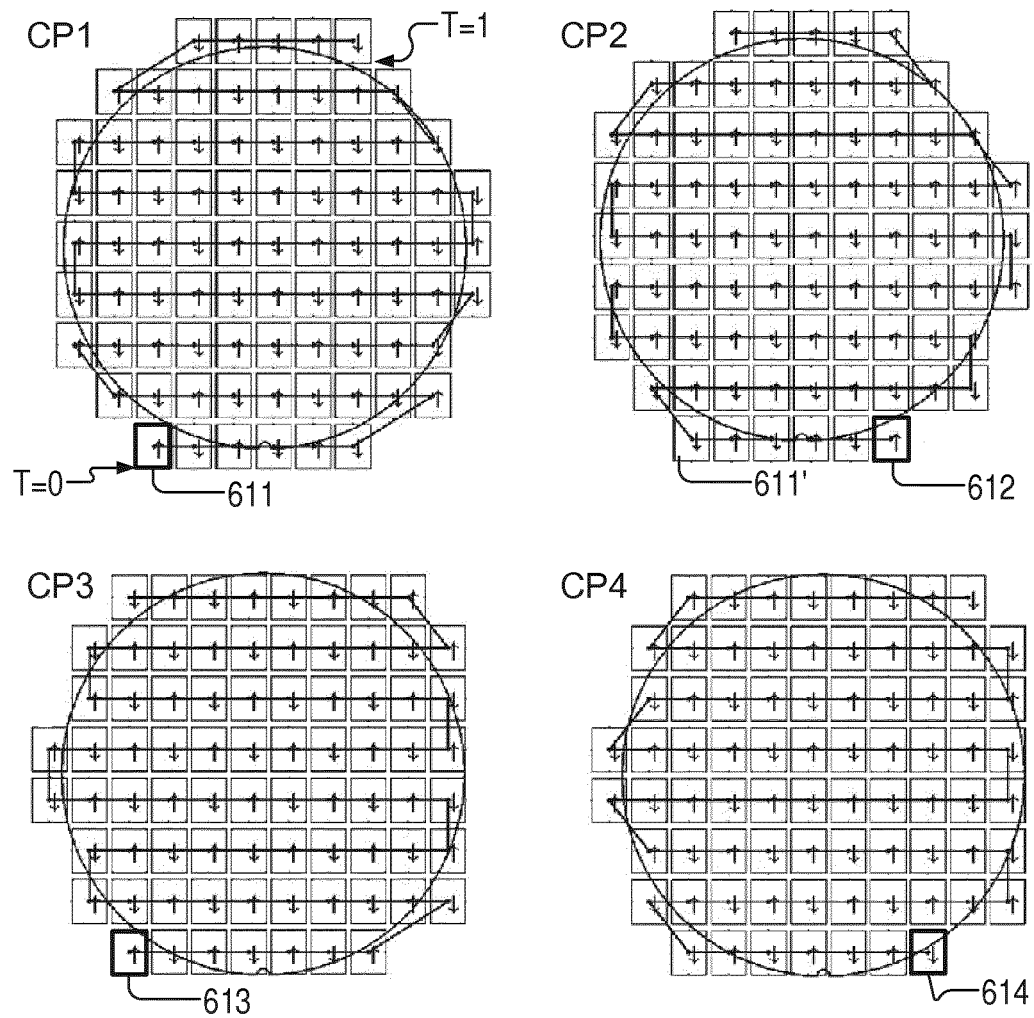
FIG. 6 illustrates the application of calibration patterns on a calibration substrate with four different exposure sequences in the method of FIG. 4.

FIG. 6 illustrates how four sets of calibration fields are applied to one or more calibration substrates using different exposure sequences and/or layouts in a real example. Four calibration exposures are labelled CP1, CP2, CP3 and CP4. (These exposures may be performed on different substrates, or they can be made as multiple exposures on the same substrate, using offsets of the type illustrated in FIG. 3.)

Exposure CP1 applies a first plurality of fields and exposure CP2 applies a second plurality of fields. As can be seen, the layout between these two exposures is the same. In the example, each exposure CP1, CP2 comprises 81 fields on a wafer of 300 mm diameter, each field being a full-size field of for example 26 mm by 33 mm. While the layout is the same between exposures CP1 and CP2, each set of fields is applied to its substrate using a different sequence of scan and step movements (different exposure sequence). Exposure CP1 begins with field 611 in a bottom left position, while exposure CP2 begins with field 612 at the bottom right position. Following a different exposure sequence, it will be seen that in each field position of the layout, the exposures CP1 and CP2 use a different scan direction and a different step direction. Thus, for example field 611 in exposure 611 has a scan up, step right (SUSR) combination, the corresponding field 611' in exposure CP2 as a scan down, step left (SDSL) combination.

Significant calibration benefits can be obtained with only two exposures, using the time-indexed performance model disclosed herein. In other embodiments, further exposures may be performed. If desired, four exposures with the same layout would allow every field position could be exposed with the four possible scan-step combinations SUSR, SDSR, SUSL, SDSL.

For additional benefit, further calibration exposures can be performed using different layouts. In the illustrated example, third and fourth exposures CP3 and CP4 are made. In the illustrated example, the layout between exposures CP3 and CP4 is the same, but different to the layout in the first and second exposures. The field size is unchanged in this example, but the field positions are shifted half a field in both the X and Y directions. The number of fields in exposures CP3 and CP4 is 77 instead of 81. The beginning fields are labeled 613 and 614. The exposure sequences for the pair of exposures CP3, CP4 are again chosen so that at each field position, the two exposures have different scan directions and different step directions. Thus by combining the fields from exposures CP3 and CP4, full coverage of the substrate by SU fields is obtained, and the same applies to SD, SR, SL. A benefit of obtaining additional measurement data with shifted field positions is that the calibration can isolate local effects on the substrate table by combining measurement data from the four exposures. Local effects can arise for example from the positioning and operation of extraction channels for immersion fluid, or other structures in the substrate table.

Referring also now to step 404 of FIG. 4, measurements are carried out on the calibration substrate(s), such as measuring the overlay error revealed by the targets 310, 312, 314, 316. Some or all of the calibration measurements can for example be carried out using the metrology apparatus 240. In some examples, some or all of the calibration measurements can alternatively be carried out using the alignment sensor AS or other sensors within the lithographic apparatus LA. All the sets of measurement data are gathered in the database 2014 for classification and subsequent processing.

Referring again to FIG. 4, in step 406 the measurement data for the individual fields is classified into sets and subsets based on a desired set of indexing variables of interest. In this particular example, the variables of interest include the scan and step directions used during the patterning operations. All measurement data from fields that have been patterned using the scan up direction can be selected using a scan direction index variable. As mentioned already, a particular indexing variable in the illustrated method is a time value. Time is a variable of interest because many sources of error arise from thermal effects and dynamic effects, that evolve with time during operation of the lithographic apparatus. Thermal effects include heating and cooling of the substrate W, heating and cooling of the reticle MA, heating and cooling of the substrate table WTa/WTb and heating and cooling of lens elements within projection system PS. Some of these effects are well understood and can be errors reduced by calculating dedicated corrections. Other time varying effects have unknown causes and characteristics. These can be corrected using the calibration methods disclosed herein.

Figure 7:
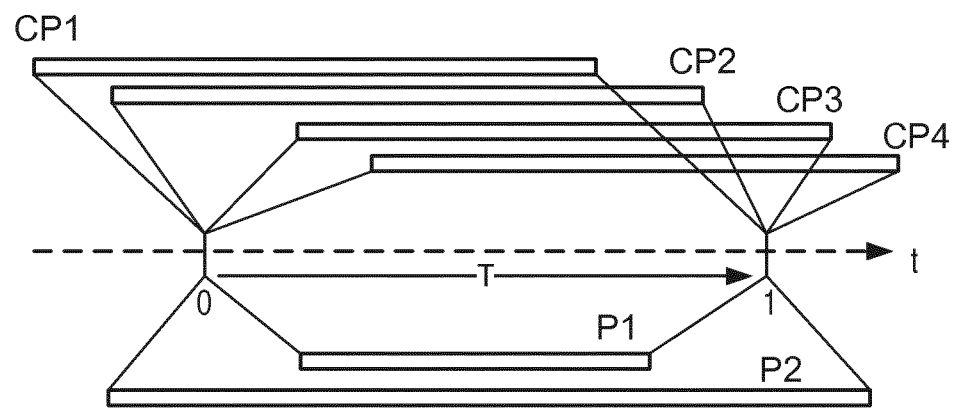
FIG. 7 illustrates the mapping of different exposure sequences to a common or normalized time scale in the method of FIG. 4.

FIG. 7 illustrates how exposure sequences of different duration are mapped onto a normalized time range T=0 to T=1. A real time axis t is shown. Bars labeled CP1 to CP4 represent the durations of the exposure sequences. The durations of exposures CP1 and CP2 are roughly equal. The durations of exposures CP3 and CP4 are a little shorter due to the fewer fields. Even with similar layouts, very different exposure durations can arise, for example by selecting different scanning speeds. Whatever the real time durations of these exposure sequences, they can all be mapped to a normalized time value T as illustrated. The normalized time value T increases from T=0, when exposure of the first field begins, to T=1 when exposure of the last field ends. While the start and end of the normalized time scale are defined in this way in the present example, the beginning and end of the exposure sequence can be defined by reference to different reference points, without departing from the principle of the disclosure. For example, the star time to be when the exposure sequence is initiated, rather than when the first part of the field is actually exposed. In a simple implementation, times within each real exposure duration are mapped to the normalized time scale by a simple linear scaling. In other embodiments, non-linear scaling can be applied, if desired.

Using the mapping illustrated in FIG. 7, any time point in the exposure sequence of exposure CP1 can be mapped to corresponding time points in exposures CP2, CP3 and CP4. Measurement data from whichever position on the substrate was being exposed at that time point can be accessed using time-based indexing in the database 2014. It is a matter of design choice, what resolution (granularity) to apply in the time indexing. In a first embodiment disclosed herein, a time value is assigned to each field, based for example on the real time at the middle of scanning that field. In a third embodiment, a time value is assigned to every position of the exposure slit as it scans up or down the field. A lithographic apparatus can of course be operated in a stepping mode, in which case the whole field will have only a single time value anyway.

As also illustrated in FIG. 7, any time point in the exposure sequence of product layouts P1, P2 can also be mapped to a normalized time value T.

Figure 8:
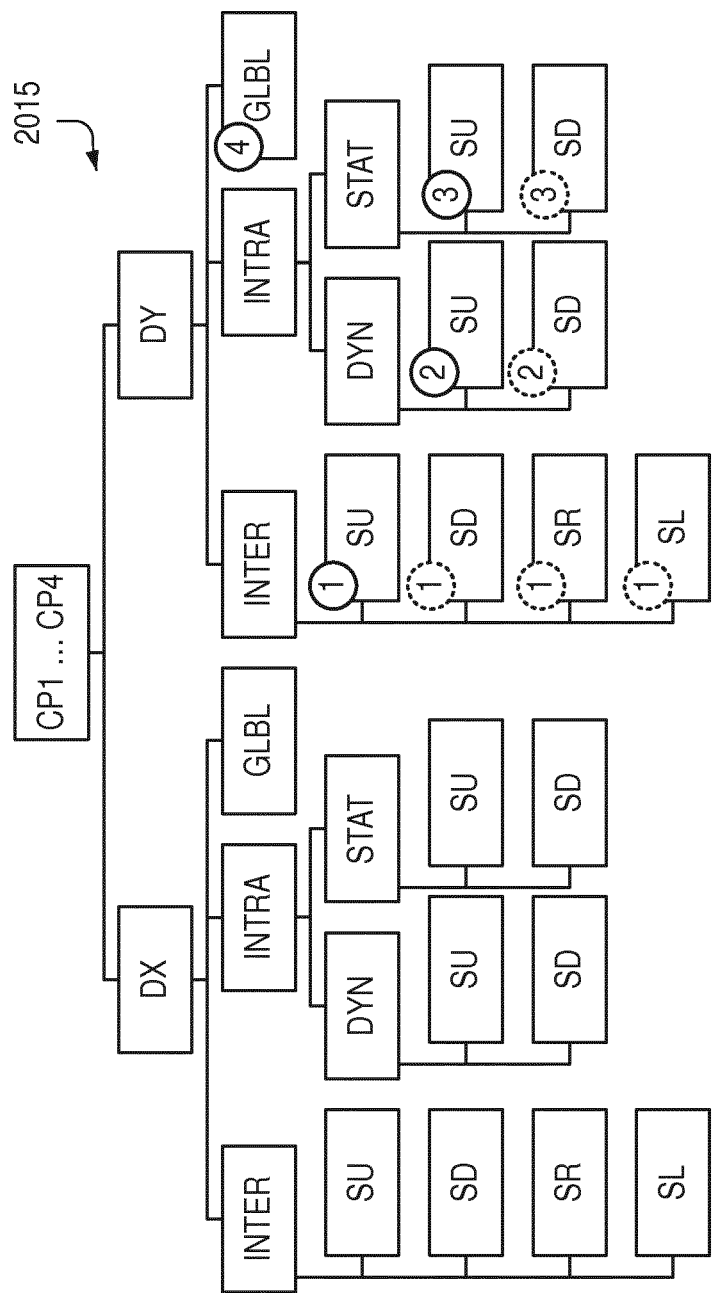
FIG. 8 illustrates the structure of a performance model in one embodiment of the method of FIG. 4.

Referring now to FIG. 8 in conjunction with FIG. 4, step 408, FIG. 8 shows the structure of the performance model 2015 in a first embodiment of the present disclosure. Using the indexing variables of the database 2014, different subsets of measurement data from the exposures CP1 to CP4 are accessed and used to calculate various components of a performance model. In the case where the measurement data are overlay error measurements, performance is modeled separately in terms of overlay DX in the X direction and overlay DY in the Y direction. In the present example, processing in both branches DX and DY is identical, but this need not be the case. Referring to the DY model as an example, "intra-field" and "inter-field" error components ("fingerprints") are extracted from measurement data. As is well-known the errors present in the lithographic process include errors that recur systematically depending on the position (xf, yf) within each field and those errors that recur systematically as a function of position (xw, yw) on the substrate as a whole.

Each component of the performance model 2015 comprises a suitable parameterized model fitted to a certain subset (sub-sampling) of the measurement data. The skilled reader is aware of the range of different models that can be employed. The most common example is a two-dimensional polynomial model. The order of the model (the number of coefficients of the polynomial) is selected to achieve a desired spatial frequency response. For inter-field components, a model based on radial functions may be preferred. The different subsets are accessed using the index variables. In the illustrated performance model for DY, inter-field components are in the branch DY-INTER. Inter-field components SU, SD are generated by fitting models to the data for the scan up fields and scan down fields, respectively. Similarly, inter-field components SR and SL are generated by fitting models to the data for the step right and step left fields, respectively. It will be appreciated that the same measurement data points will appear in more than one subset of data. For example, each field has both a scan direction and a step direction and so a given measurement point may contribute to (for example) the SU component and the SR component. Each of the components is expressed as a deviation above and below an average, so that components may be added without "double counting" a measurement.

In the intra-field branch DY-INTRA, in this example the performance model has components only related to specific scan directions SU, SD. The skilled person is familiar with methods to extract intra-field fingerprints, and a suitable method can be used for the different subsets of the measurement data. In one method, an "average field" is determined by combining measurements from all the fields in the relevant subset. This average field provides, for each intra-field position, estimates of the overlay DY. Many different types of algorithms may be considered for this purpose, and a simple average could in principle be used. Separate average fields are calculated from the subsets of the measurement data selected for each scan direction SU, SD. As in the case of the inter-field components, intra-field fingerprints are expressed as deviations from an average field, so that they contain only the component of overlay error that is specifically correlated with their particular scan direction.

In the present example, the intra-field components of the performance model are divided into dynamic (DYN) components and static (STAT) components. The dynamic component for each scan direction defines an intra-field performance that varies with the time value T. In other words, each of the dynamic components DYN-SU and DYN-SD is a three-dimensional model, representing the way in which the intra-field component of overlay error DY varies over time during the exposure sequence. The static components are simple two-dimensional models.

A "global" component GLBL is also provide in each branch on the performance model. Generation of these components will be described in more detail below.

Figure 9:
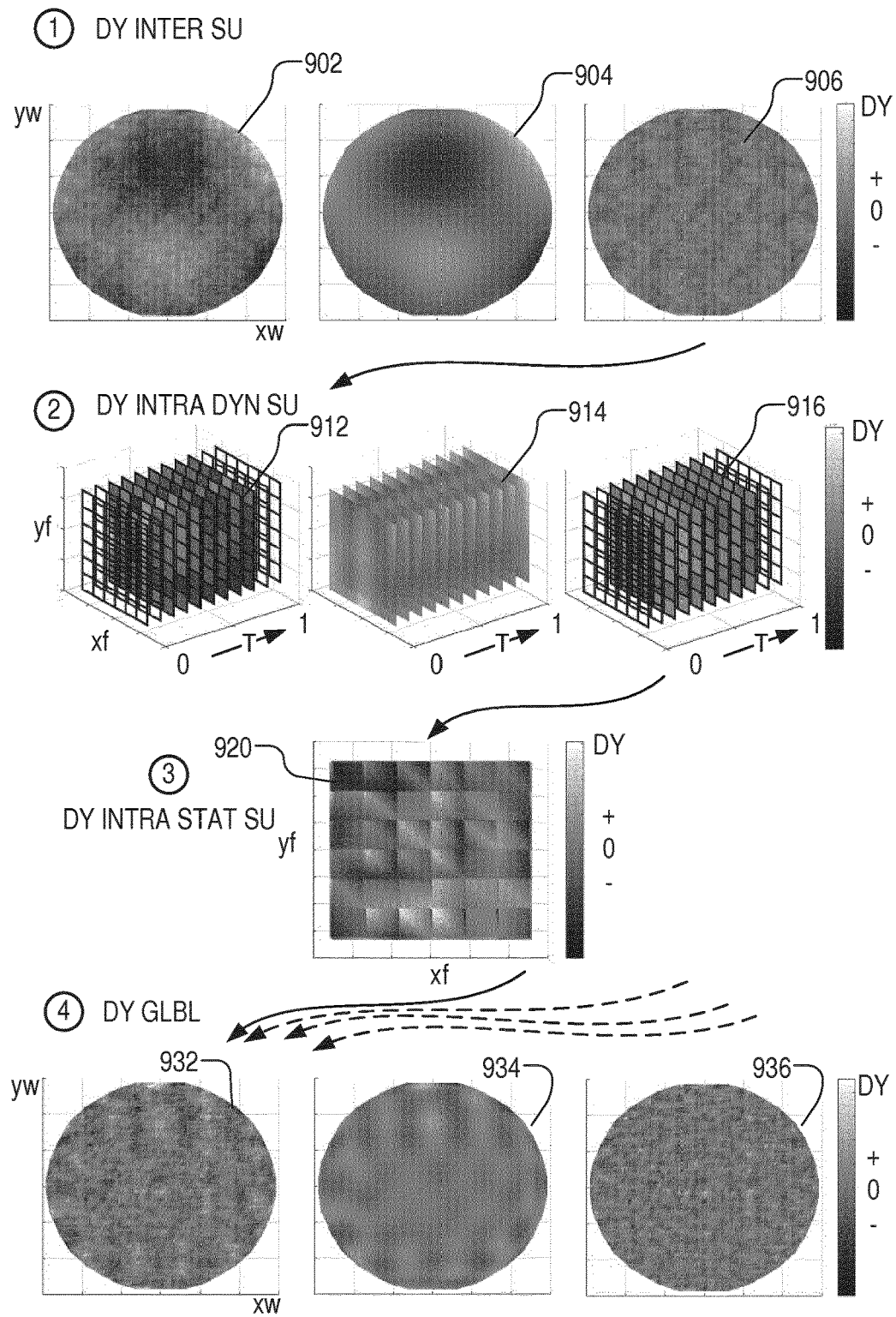
FIG. 9 illustrates the calculation of certain example components in the performance model, including a dynamic intra-field component indexed by a time value.

FIG. 9 illustrates the generation of the components of the performance model for the overlay error component DY, with reference to the scan up (SU) components only. The processing for the other components is similar, with only the index variables changing. In the present example, a sequence of calculations is performed that are labeled by circled numbers (1), (2), (3) and (4) in FIG. 9. The same circled numbers are marked on FIG. 8, for ease of reference.

In a first step (1), the inter-field component DY-INTER-SU is calculated first. Overlay measurement data 902 is represented by shading on a map of a substrate. The horizontal axis of this map is the position xw in the X direction, and the vertical axis is position yw in the Y direction. A mid-grey shade represents zero overlay error measured at that point on the calibration patterns. The scale represented by shades from black to white is arbitrary, but may be for example on the order of a few nanometers. Note that this data is not from a single exposure, but from a combination of measurements from multiple exposures such as the exposures CP1-CP4. This measurement data has been stored and classified in database 2014 and sub-sampled using the indexing variable scan direction and selecting the value SU. Optionally, certain corrections that will be made by other mechanisms within the lithographic apparatus may have been subtracted, so that the input for the present performance model contains only the uncorrected overlay error.

A parameterized model is fitted to the received data to obtain an inter-field component 904. This component is also represented on a map of the substrate and is a function of the position (xw, yw). It will be seen that the performance model in this example is a relatively low order polynomial or other suitable model, producing a smoothed representation of the overlay variations observed across the substrate. In the illustrated example, the fit is an $8^{th}$ order polynomial in xw and yw. Having calculated the inter-field component 904 of the performance model, this is subtracted from the measurement data 902 to obtain residual component 906. It can be observed that the residual data has fewer low spatial frequencies, and also has less extreme shading, as would be expected if there is a strong inter-field component in the measured overlay error. This component can be corrected in product exposures, using the performance model to calculate an inter-field correction.

Not shown in FIG. 9, similar calculations are performed to obtain inter-field components of the performance model for the scan down direction (SD component), for the step directions SR, SL. (Similar calculations are performance of course for the DX component of overlay, but those are quite independent of the DY component, in this implementation.)

In the next step (2), the dynamic component DY-INTRA-DYN-SU of the intra-field performance model is calculated, using the residual component 906 as input. This being the intra-field component, measurement data from all the fields having scan up exposure is combined into intra-field measurement data 912 with spatial dimensions corresponding to the dimensions of the largest field size. Intra-field position is indicated by coordinates xf, yf. This being a dynamic component, the data is not only indexed by intra-field position, but also indexed by the normalized time value T as a third dimension. The data 912 is presented as a series of slices. In the real example, the number of slices is greater than can be shown in the drawing. The number of slices corresponds to the number of fields in the calibration exposures CP1-CP4, and the data from each field is placed at the appropriate time value. In other embodiments, the measurement data for different parts of a field may be assigned different time values. Time increases continuously as the exposure slit of the lithographic apparatus scans up or down across the field. On the other hand, for simplicity in the present embodiment, all the measurement data from each field is assigned a single time value, corresponding to the exposure time of the field center. It is a matter of implementation whether the actual time values are converted to normalized time scale when they are entered in the database, or whether conversion happens when the database is interrogated.

Referring back to FIG. 3, the illustrated example assumes that each field is sampled by a 7×7 grid of measurements. Some grid positions will be empty as shown, where a field overlaps the edge of the substrate. This sampling is represented by the black filled target areas among the target areas 308 in FIG. 3. Of course a higher or lower density of spatial sampling can be chosen if desired. The skilled reader will appreciate that a balance needs to be made so that the number of samples is sufficient for the desired accuracy of the model, but not so great that the calibration time becomes unacceptable. The sampling points need not be on a regular grid, and need not be the same in all fields. Note that the range of DY values represented by the shading in this illustration is smaller than in the data 902-906.

Based on the time-indexed intra-field data 912, a dynamic intra-field component 914 of the performance model is calculated (DY-INTRA-DYN-SU). This is another parameterized model fitted in three dimensions. In the spatial dimensions, a low order polynomial (e.g. $4^{th}$ or $6^{th}$ order in xf and yf) may be used. In the time dimension, a parameterized model can be used, or the model may simply comprise a number of slices interpolated from the data 912 (in other words a first order fit). In this example, the number of slices may be of the same order as the expected number of fields. The number of slices may be lower, if lower resolution on the time axis will be sufficient.

As mentioned above, there may be situations in which the field size exposed for calibration is smaller than the maximum field size. In particular, if the lithographic apparatus is used only to manufacture products with smaller field sizes, a more accurate performance model may be obtained using calibration exposures with layouts and field sizes closer to the product field sizes. In that case, the spatial range of data 912 will be restricted. If it is desired to maintain a given number of samples per slice (e.g. to maintain a 7×7 grid) the spatial sampling density in the central part of the field may be increased. Extrapolation outside the grid of measured sample points may introduce errors and is not recommended.

Having calculated the dynamic intra-field component 914 of the performance model, this is subtracted from the intra-field measurement data 912 to obtain residual intra-field data 916. It can be observed that the residual data has less extreme shading, as would be expected if there is a strong intra-field component in the measured overlay error. The dynamic intra-field component 914 can be corrected in product exposures, using the performance model to calculate an inter-field correction based on intra-field position and time.

In the third step (3), a static intra-field component 922 (DY-INTRA-STAT-SU) is calculated from the residual intra-field data 916. The time value is ignored in this static component, so that the 3-dimensional residual data 916 collapses into the two dimensional space. Rather than fitting any model to the data, in this component the raw measurement data are stored, indexed by intra-field position. Interpolation can be performed when required, for example using a scattered interpolant fit with linear interpolation, or using a 2-dimensional polynomial fit. The shading in the squares of this grid is an artifact of the data visualization. Data points in this example exist only around the corners of the squares. Although a rough 7×7 array of sample points can be observed, intra-field positions are stored with enough precision that the small offsets shown in FIG. 3 are fully represented. Note that the range of DY values represented by the shading in this illustration is much smaller than in the earlier plots. The residual data 916 has much lower amplitude than the earlier components.

Not shown in FIG. 9, similar calculations are performed to obtain dynamic and static intra-field components of the performance model for the scan down direction (SD component). In the present example, intra-field components are not calculated for the different step directions SR, SL, but in another implementation they could be. (Such an implementation is described below, with reference to FIG. 11.)

In the fourth step (4), residual data 932 extending over the whole substrate is calculated as an input to obtain the "global" component DY-GLBL of the performance model 800. The residual data is calculated by subtracting all of the inter-field and intra-field components from the original measurement data 902, not only the SU component. In this way, residual data 932 represents a component of overlay that is not going to be corrected by any correction calculated from those other components of the performance model. Again the range of DY values represented by the black-white shading is smaller than in the earlier plots, so that the residual overlay is of very low amplitude. However, it may contain components that are systematic and related to peculiarities of the individual lithographic apparatus. To model this residual overlay, a further two-dimensional parameterized model 934 is defined, using a relatively high order fitting function. The parameterized model may for example be an $18^{th}$ order polynomial in two dimensions, to allow higher spatial frequencies to be represented than can be represented in the inter-field component 904.

Having obtained the final component 934 of the DY-SU model, a further residual component 936 can be calculated by subtracting component 834 from the data 932. This residual component 936 exhibits a low level, high-frequency character, which should be expected. However, there may also be systematic components that can be identified by further analysis, and corrected. For example the plot 936 reveals some circular patterns that may be corrected by a suitable model component. The residual plot may also provide information about root causes of errors, allowing maintenances and/or design improvements.

Having calculated all the components of the performance model 800, we refer again to the flow of FIG. 4, step 410, the various inter-field and intra-field components of the performance model 2015 are used to predict performance for a real product substrate having a specific layout 2016 and a specific exposure sequence. The performance model 2015 can be described as a "generic" or "master" performance model, from which specific performance models can be derived for a variety of specific product layouts and exposure sequences. It may be useful that performance can be predicted for alternative exposure sequences as an "experiment", without running any specific calibration substrates of the actual field size. More importantly, however, in step 412, corrections based on some or all of the performance model components are calculated. These corrections are synthesized from the different components of the performance model, selected by reference to the indexing variables, such as the specific scan and step direction used in each field of the product exposure sequence. Furthermore, for dynamic components, the specific correction is selected also by reference to the time within the product exposure sequence, mapped to the normalized time value used in the performance model.

In some cases, it may be desired for the dynamic components to be scaled in accordance with one or more parameters of a product exposure recipe. For example, some dynamic effects may scale according to one or more variables. Examples of such variables include field size, number of exposed fields in a row, scan speed, exposure dose settings. These scale factors and variables may be determined empirically by fitting to appropriate sets of calibration data. These scale factors may alternatively be determined or adjusted by feedback, once production is under way. (Measurements on production substrates can be used to monitor the specific components identified by the performance model, and to correct drift by feedback.)

In step 414 some or all of the components of the performance model 800 are used to calculate one or more sets of correction parameters for use in controlling the lithographic apparatus to apply product patterns to product substrates. For each field on the product substrate, scan direction, step direction, inter-field position and intra-field position are used to select appropriate components of the performance model. Unlike conventional methods, the time value that increases during the product exposure sequence is used as an additional indexing variable, so that time-varying effects can be corrected more accurately.

As mentioned, scan direction and step direction are just two possible indexing variables. The measurement data can be indexed and sub-sampled according to any desired combination of parameters. For example, peripheral regions of the substrate may be classified separately to allow an edge-related component to be added to the performance model, and edge-related errors can be predicted and/or corrected.

As indicated by broken lines in FIG. 4, steps 410, 412, 414 can be repeated for different product layouts and different product exposure sequences, without repeating the costly calibration exposures and measurements of steps 402 and 404. Moreover, it is found that a significant improvement in overlay performance can be obtained with relatively little calibration overhead. Depending on the types of error sources to be corrected, only two calibration exposures CP1 and CP2 may be sufficient. For some localized effects on the substrate scale, adding another pair of calibration exposures CP3, CP4 may be beneficial. However, these few calibration exposures can be used to generate specific corrections for a wide range of layouts and exposure sequences. thereafter.

In the above examples, calibration exposure layouts and exposure sequences have been designed in pairs, or in fours, in which each exposure complements the other(s) to provide full coverage of the substrate area by each subset of scan and step directions. Calibration exposures do not need to be arranged in such complementary pairs or groups, to achieve the same overall effect, however, and any suitable arrangement of calibration layouts and exposure sequences can be used. Incomplete coverage of the substrate area by some components may be tolerable, for example to gain some other benefit.

Figure 10:
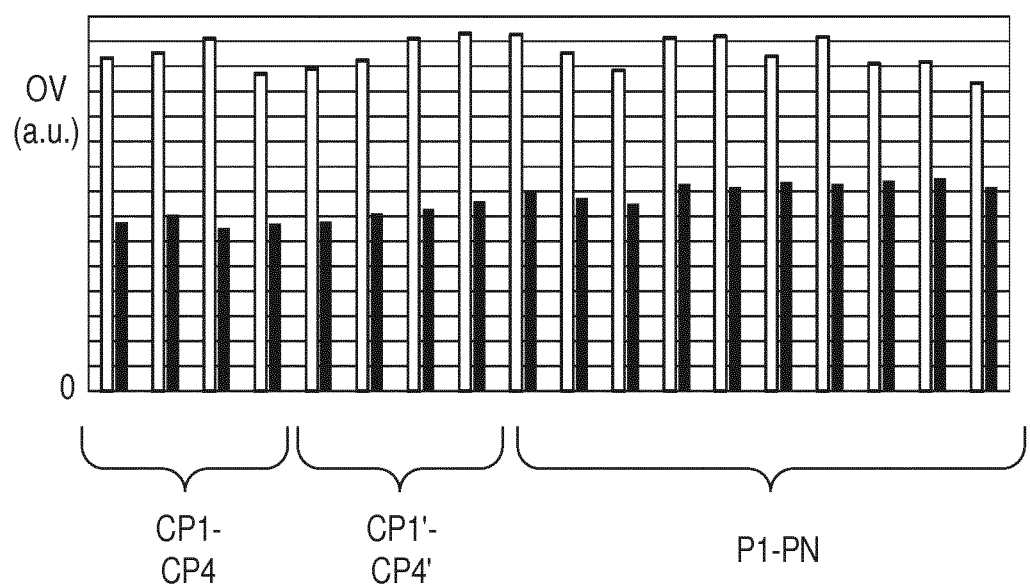
FIG. 10 illustrates performance improvement using the method of FIGS. 4 and 9 over a variety of product layouts.

FIG. 10 shows results of using the performance model of FIGS. 8 and 9 to correct exposures of various different product layouts and exposure sequences. Along the horizontal axis, different layouts and exposure sequences are arranged. The vertical axis represents overlay OV on an arbitrary scale. Different performance measures are available to be specified. Bars in this graph indicate the maximum DX or DY value, to 99.7% confidence, over both chucks of the lithographic apparatus. White bars represent maximum overlay not using the performance model disclosed herein. The black bars represent maximum overlay after correction by the method of FIGS. 4, 8 and 9.

It can be seen that the performance after correction is greatly improved in all cases. The first four exposures are the identical substrates CP1-CP4 that are used as input to the calibration. It would be expected that these are well corrected. The next four exposures CP1'-CP4' have the same layouts and exposure sequences but on different substrates, different handling cassettes (FOUPs) and with different exposure speeds. Using the normalized time value T as an index, time-based components can be modeled and corrected despite the different speeds. Again it can be seen in the black bars that good improvement is obtained.

The last group of exposures are for a variety of product layouts P1, P2 etc. These have different field sizes and exposure sequences, including some layouts with only quarter-sized fields. Despite the wide variety of product layouts, it will be seen from the black bars that good improvement of overlay is still obtained. While a layout-specific calibration might yield a slight further improvement, the benefit of not having to do a layout-specific calibration for every product and recipe is substantial.

The database 2014 and prediction model 2015 provide great flexibility to implement "domain specific" calibrations, that is calibrations that are not based on measurements of the exact product layout and sequence, but are based on measurements selected to be the ones most relevant for a particular class of product layouts and product exposure sequences. In that regard, while performance model 2015 is shown as a single block in FIG. 2, the model can effectively be changed using the indexing variables to select the input data for a given product layout.

An example of this domain specific calibration can been given for use in predicting performance of a range of product layouts that all have smaller field sizes. The calibration exposures for use in this domain may be designed to use a smaller field size than the full field size. Therefore, in a situation where the lithographic apparatus is used for a variety of layouts that all have smaller field sizes, a smaller field size can be chosen for the calibration exposures, provided it is roughly the same size or larger than the larges field size among the intended product layouts. When the calibration field size is made closer to the product field sizes, better accuracy may be expected in the performance model. Extrapolation from a smaller calibration field to a larger product field is possible in theory, but is likely to suffer from errors.

Note that field size is another variable that can be used for indexing in the measurement data. Therefore a database 2014 that contains measurements from full-field exposures and small field exposures can be used selectively to produce a performance model optimized for certain subsets of all possible production layouts. This is just one example of the more general capability of domain specific calibration.

Figure 11:
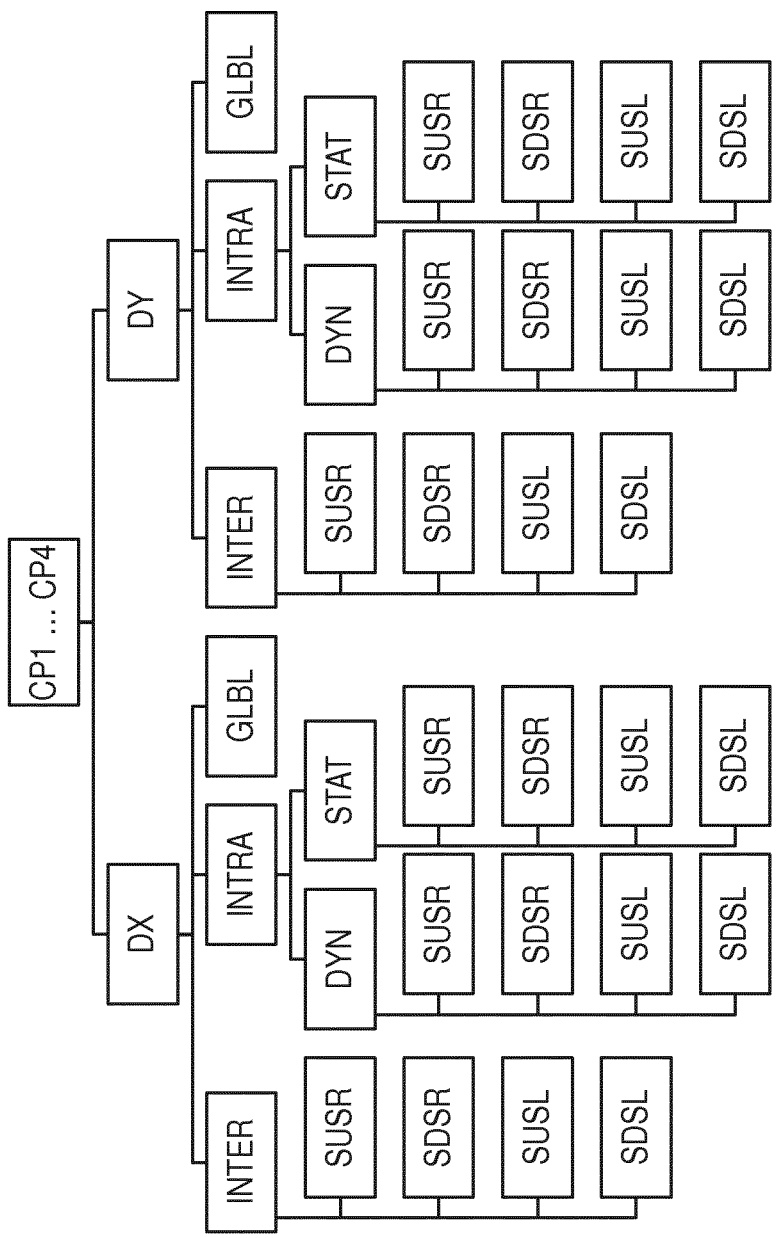
FIG. 11 illustrates the structure of a performance model in a second embodiment of the method of FIG. 4.

FIG. 11 illustrates for the sake of example a second example of a performance model 1100. This is of a form very similar to performance model 800, and will not be described in detail. The difference that will be noted is that, instead of having components specific to scan up and scan down directions, and components specific to step right and step left directions, this model has subsets specific to the four combinations of movements: scan up/step right (SUSR), scan down/step right (SDSR), scan up-step left (SUSL) and scan down, step left (SDSL). To properly support this model, additional calibration exposures may be needed, so that for each layout the full set of combinations can be exposed at each field position. As in the example of FIG. 8, only the intra-field components in this example have a dynamic (time-indexed) component, but that is a matter of design choice.

Figure 12:
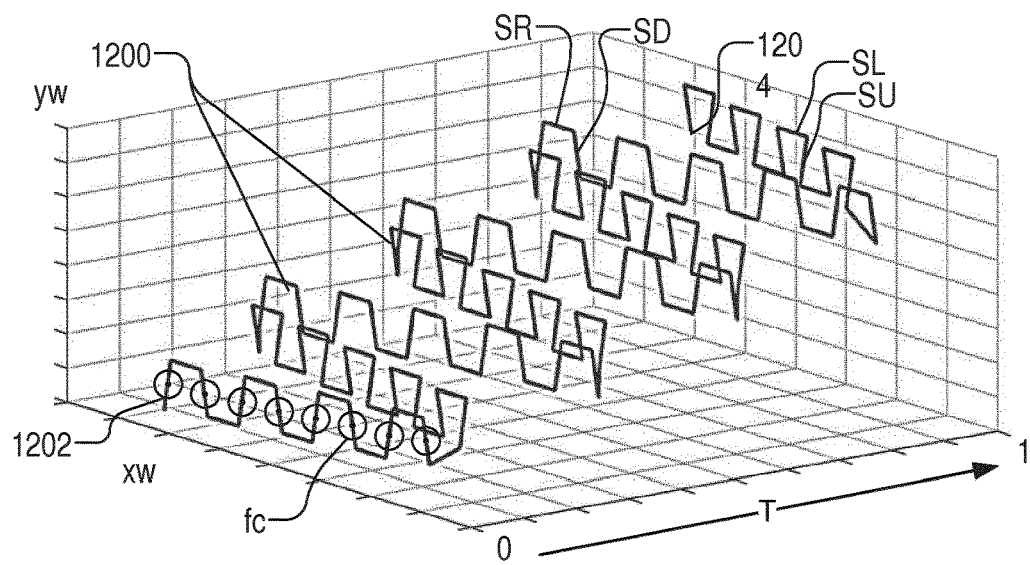
FIG. 12 is a plot of slit position during an example exposure sequence in a third embodiment of the method of FIG. 4.
Figure 13:
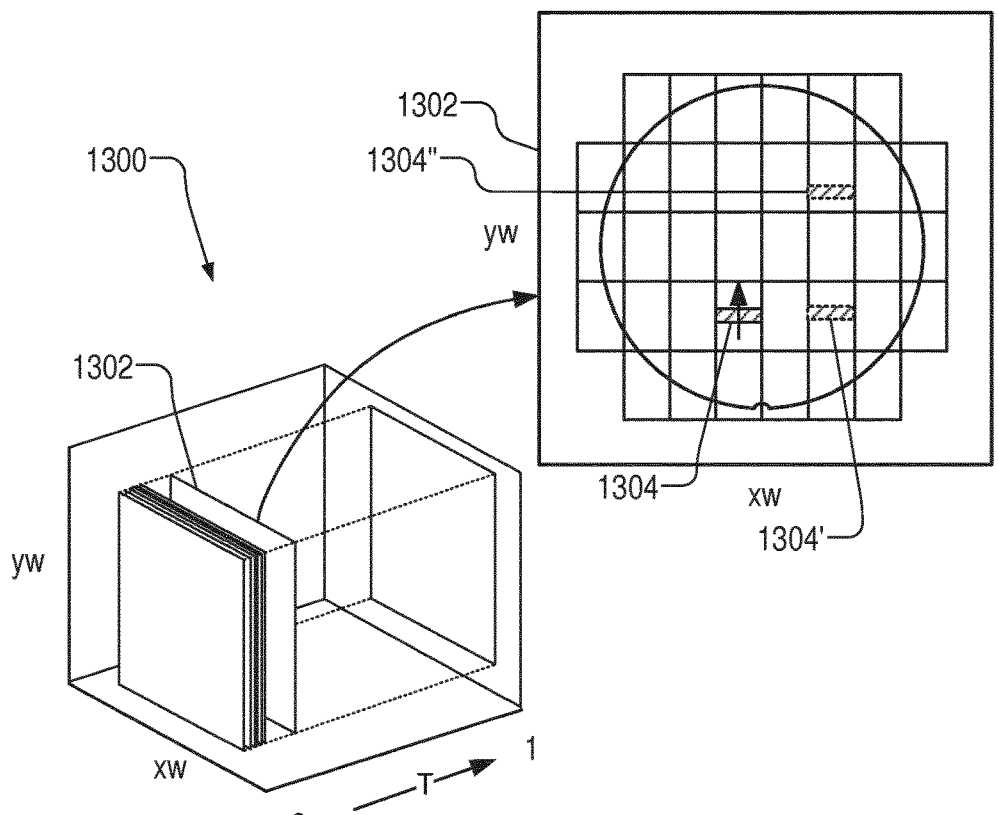
FIG. 13 illustrates a dynamic inter-field component indexed by time value in the third embodiment of the method.

FIGS. 12 and 13 illustrate a third embodiment of the disclosure, in which the time value is continuously representing slit position, and not grouped into a single time value per field. Moreover, in this example, an inter-field component is modeled in a time-indexed way. Inter-field and intra-field components are effectively combined.

FIG. 12 is a 3-dimensional plot of slit position against the substrate coordinates xw, yw and against normalized time T. Different segments of the slit position trace 1200 can be recognized as step movements and scan movements. Some of these are labeled SU, SD, SR, SL for ease of understanding. In the real exposure sequence, transitions between step and scan movements can be more rounded than is shown here. The exposure sequence begins at time T=0 with the beginning of a scan up movement 1202 and ends at time T=1 with the end of a scan down movement 1204. Field centers fc are marked on the first row of scan movements. In the previous example, the time values of the field centers were used to index all data for a field. The database in this example indexes all measurements with the continuous time value illustrated.

FIG. 13 illustrates an inter-field component of a performance model using the continuous time data shown in FIG. 12. The model is 3-dimensional in the same manner as the component 914 in FIG. 9, and is generated by fitting a parameterized model in three dimensions to on measurement data from a number of calibration exposures. The spatial dimensions extend across the full substrate, with inter-field coordinates xw, yw. Also, while the model is represented in slices in the drawing, these are based on continuously varying slit position, rather than one slice per field. While the performance model illustrated has coordinates xw, yw and time, other selections of index variables can be used. In a particular variant, the performance model may be indexed by xw, yf and time. The fit will then be one per step direction in time. In either case, the database is split to process SU and SD fields separately.

One slice 1302 is illustrated in front view, with a substrate outline and example field layout superimposed. A slit position 1304 corresponding to the time value of slice 1304 in one of the calibration exposures is illustrated. Different calibration exposures have different exposure sequences and/or different layouts, so that the complete set of measurement data relating to the same point in time may be derived from different slit positions 1304', 1304" in the spatial dimensions. The slit sizes may vary as well.

Compared with the intra-field data that is averaged from many fields, it will be appreciated that the measurement data in this example is taken from relatively few samples, for each point in the performance model. However, where a time-variable contribution of overlay error is caused by local effects on the scale of the substrate, a performance model of the type illustrated in FIGS. 12 and 13 can be very effective in correcting such contributions. As in the previous examples, the measurement data will be subsampled using the indexing variables to generate performance model components for scan directions SU, SD and step directions SR, SL, or for scan-step combinations SUSR, SDSR, SUSL, SDSL.

As mentioned in the previous example, the time-indexed component can be scaled to allow for different operating conditions such as scanning speed, field size, field number per row, exposure dose, and the like.

As mentioned above, the predicted performance and the correction parameters are very closely related and one or other of them may be implicit in the data actually prepared, rather than explicit. That is to say, if the prediction functions predict an overlay error of, say +1.2 nm in the x direction, implicitly this suggests a correction of −1.2 nm should be applied. Provided that the control system as a whole interprets the values so that the predicted error is reduced when the real pattern is applied in operation, it is a matter of choice whether the prediction function is designed to deliver the value +1.2 nm or −1.2 nm. Consequently, terms such as "correction parameters" should not be interpreted as excluding "predicted performance", and vice versa. Correction parameters of course can be expressed as an array of points, but more likely they will be expressed in terms of coefficients of polynomials that are defined in existing alignment models and correction functions.

CONCLUSION

The methods and associated lithographic apparatuses disclosed herein enable one or more of the following benefits.

The method allows for changes in overlay error that are due to a change in (for example) field layouts and exposure sequences to be modeled and corrected without necessitating a separate calibration measurement.

The method improves the calibration process since it allows changes in overlay due to the scanning and stepping direction of a patterning device during a patterning operation to be taken into account without increasing the calibration burden for every new product.

The method can be implemented using new types of calibration patterns, or using existing types.

The calculations necessary to establish the prediction functions can be performed in the lithographic apparatus, in a metrology apparatus, or in offline systems. No hardware modification of the lithographic apparatus is required, as the correction parameters can be in the same format as correction parameters derived from actual measurements on a particular field size and exposure sequence.

The invention may further be described using the following clauses:

1. A method of predicting performance of a lithographic apparatus, the method comprising:

providing first measurement data for a first plurality of fields that have been exposed by the lithographic apparatus on one or more substrates using a first exposure sequence;

providing further measurement data for one or more further pluralities of fields that have been exposed by the lithographic apparatus on one or more substrates, each of the one or more further pluralities of fields having been exposed using an exposure sequence different from the first exposure sequence; and generating a performance model based on the first measurement data and the further measurement data; and using the performance model to determine a set of data for at least a first plurality of product fields having a product exposure sequence, wherein for generating the performance model the first measurement data and further measurement data are indexed at least partly on the basis of a time value that varies over each exposure sequence, and wherein the set of data for the product fields is generated at least partly by reference to a time value that varies over the product exposure sequence.

2. A method of calibrating a performance model for a lithographic apparatus, the method comprising:

providing first measurement data for a first plurality of fields that have been exposed by the lithographic apparatus on one or more substrates using a first exposure sequence;

providing further measurement data for one or more further pluralities of fields that have been exposed by the lithographic apparatus on one or more substrates, each of the one or more further pluralities of fields having been exposed using an exposure sequence different from the first exposure sequence; and calibrating the performance model based on the first measurement data and the further measurement data, wherein the performance model is configured to generate a set of data for at least a first plurality of product fields having a product exposure sequence, and wherein for generating the performance model the first measurement data and further measurement data are indexed at least partly on the basis of a time value that varies over each exposure sequence, and wherein the set of data for the product fields is generated at least partly by reference to a time value that varies over the product exposure sequence.

3. A method according to clause 1 or 2, wherein the time values for different exposure sequences are related via a time scale defined by reference to a beginning and an end of each exposure sequence.

4. A method according to any of clauses 1 to 3, wherein the first measurement data and further measurement data are further indexed on the basis of a scan direction that varies between fields within each exposure sequence, and wherein the set of data for the product fields is generated at least partly by reference to a scan direction that varies within the product exposure sequence.

5. A method according to clause 4, wherein for each scan direction said performance model includes an intra-field component and said intra-field component is indexed by said time value.

6. A method according to any preceding clause, wherein said further measurement data includes data relating to a second plurality of fields having the same positions as the first plurality of fields but having a second exposure sequence different from the first exposure sequence.

7. A method according to clause 6 wherein the first exposure sequence and the second exposure sequence comprise different scan directions at each field position.

8. A method according to any preceding clause, wherein the first measurement data and further measurement data are further indexed on the basis of a step direction that varies between fields within each exposure sequence, and wherein the set of data for the product fields is generated at least partly by reference to a stepping direction that varies within the product exposure sequence.

9. A method according to any preceding clause, wherein said further measurement data includes data relating to one or more further pluralities of fields having positions on the substrate different than the positions of the first plurality of fields.

10. A method according to any preceding clause, wherein said further measurement data includes data relating to one or more further pluralities of fields having a field size different than the a field size of the first plurality of fields.

11. A method according to any preceding clause, wherein generating the performance model includes:

based on said first measurement data and further measurement data, generating an inter-field component of said performance model;

based on a residual of said first measurement data and further measurement data after applying a correction based on said inter-field performance model, generating an intra-field component of said performance model.

12. A method according to clause 11, wherein said intra-field performance model includes a dynamic intra-field component that is indexed by said time value.

13. A method according to clause 12, wherein said intra-field performance model further includes a static intra-field component that is not indexed by said time value.

14. A method according to any of the clauses 11 to 13, wherein different intra-field components are generated for fields exposed with different scan directions.

15. A method according to any preceding clause, wherein generating the performance model includes:

based on said first measurement data and further measurement data, generating an inter-field component of said performance model, and wherein said inter-field component includes a dynamic inter-field component that is indexed by said time value.

16. A method according to any of the clauses 11 to 15, wherein different inter-field components are generated for fields exposed with different scan directions.

17. A method according to any of the clauses 11 to 16, wherein different inter-field components are generated for fields exposed with different step directions.

18. A method according to any preceding clause, wherein in generating said set of data for the product fields, a scaling factor is applied to one or more components of the performance model based on parameters of the product exposure sequence.

19. A method according to any preceding clause, further comprising: using the performance model to determine a set of data for at least a second plurality of second product fields having a second product exposure sequence and wherein the second product exposure sequence differs from the first product exposure sequence in one or more of field size, exposure speed.

20. A method according to any preceding clause, wherein providing the first measurement data comprises:

applying a calibration pattern sequentially to the at least one substrate to the first plurality of fields using the first exposure sequence; and performing a measurement on the applied patterns.

21. A method according to clause 17, wherein the calibration pattern is repeatedly applied to one or more substrates using different exposure sequences to obtain said further measurement data.

22. A method according to any preceding clause, wherein a calibration pattern has been applied repeatedly to fields on the same substrate while applying a shift between repetitions, to obtain at least some of both the first measurement data and the further measurement data from the same substrate.

23. A method of calibrating a lithographic apparatus, the method comprising:

obtaining a performance model generated by the generating step of a method according to any preceding clause;

using the performance model to determine a set of data for a plurality of product fields by the using steps of the method of any preceding clause; and based on the set of data for the first plurality of product fields supplying corrections to be used by the lithographic apparatus when applying product fields on a product substrate using the product field layout and product exposure sequence.

24. A method according to clause 23, wherein said set of data predicts overlay performance of the lithographic apparatus.

25. A method according to clause 23 or 24, wherein said set of data predicts focus performance of the lithographic apparatus.

26. A method of controlling a lithographic apparatus comprising:
receiving corrections that have been generated by a method according to any of the clauses 23, 24 or 25;
causing the lithographic apparatus to apply one or more product patterns using the received corrections.

27. A method of manufacturing a device comprising:
controlling a lithographic apparatus to apply one or more product patterns by a method according to clause 26; and
forming functional device structures on the substrate in accordance with the applied product pattern.

28. A processing apparatus for predicting performance of a lithographic process, the apparatus comprising a processor arranged for performing the steps of a method according to any of the clauses 1 to 22.

29. An apparatus for calibrating a lithographic apparatus, the apparatus comprising:
storage containing a performance model generated by the generating step of a method according to any of the clauses 1 to 22;
a processor arranged for using the performance model to determine a set of data for at least a first plurality of product fields having a product field layout and a product exposure sequence; and
a processor for using the set of data to generate corrections to be used while applying a product pattern to plurality of product fields on a product substrate using the product filed layout and product exposure sequence.

30. A control system for a lithographic apparatus, the control system comprising:
an apparatus according to clause 29 for generating corrections to be used by the lithographic apparatus; and
a controller for causing the lithographic apparatus to apply one or more product patterns using the generated corrections.

31. A computer program product comprising machine readable instructions which, when run on a suitable processor, cause the processor to perform the generating and using steps of the method according to any of the clauses 1 to 22.

32. A computer program product comprising machine readable instructions which, when run on a suitable processor or processors, cause the processor(s) to implement an apparatus according to clause 29.

33. A computer program product comprising machine readable instructions which, when run on a suitable processor or processors, cause the processor(s) to implement a control system according to clause 30.

Although specific reference may be made in this text to the use of lithographic apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. Furthermore, parts of the apparatus may be implemented in the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method comprising:
providing first measurement data for a first plurality of fields that have been exposed by a lithographic apparatus on one or more substrates using a first exposure sequence;
providing further measurement data for one or more further pluralities of fields that have been exposed by the lithographic apparatus on one or more substrates, each of the one or more further pluralities of fields having been exposed using an exposure sequence different from the first exposure sequence;
generating, by a hardware computer system, a particular performance model based on both the first measurement data and the further measurement data; and
using, by the hardware computer system, the performance model to determine a set of data for at least a first plurality of product fields having a product exposure sequence,
wherein for generating the performance model the first measurement data and further measurement data are indexed at least partly on the basis of a time value that varies over each exposure sequence, and wherein the set of data for the product fields is generated at least partly by reference to a time value that varies over the product exposure sequence.

2. The method as claimed in claim 1, wherein the time values for different exposure sequences are related via a time scale defined by reference to a beginning and an end of each exposure sequence.

3. The method as claimed in claim 1, wherein the first measurement data and further measurement data are further indexed on the basis of a scan direction that varies between fields within each exposure sequence, and wherein the set of data for the product fields is generated at least partly by reference to a scan direction that varies within the product exposure sequence.

4. The method as claimed in claim 3, wherein for each scan direction the performance model includes an intra-field component and the intra-field component is indexed by the time value.

5. The method as claimed in claim 1, wherein the further measurement data includes data relating to a second plurality of fields having the same positions as the first plurality of fields but having a second exposure sequence different from the first exposure sequence.

6. The method as claimed in claim 5, wherein the first exposure sequence and the second exposure sequence comprise different scan directions at field positions.

7. The method as claimed in claim 1, wherein the first measurement data and further measurement data are further indexed on the basis of a step direction that varies between fields within each exposure sequence, and wherein the set of data for the product fields is generated at least partly by reference to a stepping direction that varies within the product exposure sequence.

8. The method as claimed in claim 1, wherein the further measurement data includes data relating to one or more further pluralities of fields having positions on the substrate different than the positions of the first plurality of fields, and/or wherein the further measurement data includes data relating to one or more further pluralities of fields having a field size different than a field size of the first plurality of fields.

9. The method as claimed in claim 1,
wherein generating the performance model includes:
generating, based on the first measurement data and further measurement data, an inter-field component of the performance model, and
generating, based on a residual of the first measurement data and further measurement data after applying a correction based on the inter-field performance model, an intra-field component of the performance model; and/or
wherein generating the performance model includes:
generating, based on the first measurement data and further measurement data, an inter-field component of the performance model, wherein the inter-field component includes a dynamic inter-field component that is indexed by the time value.

10. The method as claimed in claim 9, wherein different intra-field components are generated for fields exposed with different scan directions, and/or wherein different inter-field components are generated for fields exposed with different step directions.

11. The method as claimed in claim 1, further comprising using the performance model to determine a set of data for at least a second plurality of second product fields having a second product exposure sequence and wherein the second product exposure sequence differs from the first product exposure sequence in field size and/or exposure speed.

12. The method as claimed in claim 1, wherein a calibration pattern has been applied repeatedly to fields on the same substrate while applying a shift between repetitions, to obtain at least some of both the first measurement data and the further measurement data from the same substrate.

13. A method of calibrating a lithographic apparatus, the method comprising:
obtaining a performance model generated by the generating step of the method as claimed in claim 1;
using the performance model to determine a set of data for a plurality of product fields by the using step of the method as claimed in claim 1; and
based on the set of data for the first plurality of product fields supplying corrections to be used by the lithographic apparatus when applying product fields on a product substrate using the product exposure sequence.

14. A method comprising:
providing first measurement data for a first plurality of fields that have been exposed by a lithographic apparatus on one or more substrates using a first exposure sequence;
providing further measurement data for one or more further pluralities of fields that have been exposed by the lithographic apparatus on one or more substrates, each of the one or more further pluralities of fields having been exposed using an exposure sequence different from the first exposure sequence; and
calibrating, by a hardware computer system, a particular performance model based on both the first measurement data and the further measurement data,
wherein the performance model is configured to generate a set of data for at least a first plurality of product fields having a product exposure sequence, and
wherein for calibrating the performance model, the first measurement data and further measurement data are indexed at least partly on the basis of a time value that varies over each exposure sequence, and wherein the set of data for the product fields is generated at least partly by reference to a time value that varies over the product exposure sequence.

15. The method as claimed in claim 14, wherein the time values for different exposure sequences are related via a time scale defined by reference to a beginning and an end of each exposure sequence.

16. The method as claimed in claim 14, wherein the first measurement data and further measurement data are further indexed on the basis of a scan direction that varies between fields within each exposure sequence, and wherein the set of data for the product fields is generated at least partly by reference to a scan direction that varies within the product exposure sequence.

17. A non-transitory computer program product comprising machine readable instructions which, when run on a suitable processor system, cause the processor system to at least:
obtain first measurement data for a first plurality of fields that have been exposed by a lithographic apparatus on one or more substrates using a first exposure sequence;
obtain further measurement data for one or more further pluralities of fields that have been exposed by the lithographic apparatus on one or more substrates, each of the one or more further pluralities of fields having been exposed using an exposure sequence different from the first exposure sequence;
generate a particular performance model based on both the first measurement data and the further measurement data; and
use the performance model to determine a set of data for at least a first plurality of product fields having a product exposure sequence,
wherein for generation of the performance model the first measurement data and further measurement data are indexed at least partly on the basis of a time value that varies over each exposure sequence, and wherein the set of data for the product fields is generated at least partly by reference to a time value that varies over the product exposure sequence.

18. The computer program product as claimed in claim 17, wherein the time values for different exposure sequences are related via a time scale defined by reference to a beginning and an end of each exposure sequence.

19. The computer program product as claimed in claim 17, wherein the first measurement data and further measurement data are further indexed on the basis of a scan direction that varies between fields within each exposure sequence, and wherein the set of data for the product fields is generated at least partly by reference to a scan direction that varies within the product exposure sequence.

20. The computer program product as claimed in claim 17, wherein the further measurement data includes data relating to a second plurality of fields having the same positions as the first plurality of fields but having a second exposure sequence different from the first exposure sequence.

* * * * *